(12) United States Patent
Doi

(10) Patent No.: US 10,554,183 B2
(45) Date of Patent: Feb. 4, 2020

(54) DISTORTION COMPENSATION APPARATUS AND DISTORTION COMPENSATION METHOD

(71) Applicant: NEC Corporation, Tokyo (JP)

(72) Inventor: Yoshiaki Doi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/244,913

(22) Filed: Jan. 10, 2019

(65) Prior Publication Data

US 2019/0222179 A1 Jul. 18, 2019

(30) Foreign Application Priority Data

Jan. 12, 2018 (JP) .................................. 2018-003715

(51) Int. Cl.
*H04K 1/02* (2006.01)
*H04L 25/03* (2006.01)
*H04L 25/49* (2006.01)
*H03F 1/32* (2006.01)

(52) U.S. Cl.
CPC ......... *H03F 1/3247* (2013.01); *H03F 1/3258* (2013.01); *H03F 1/3282* (2013.01); *H03F 2201/3224* (2013.01); *H03F 2201/3233* (2013.01)

(58) Field of Classification Search
CPC .... H03F 1/3247; H03F 1/3258; H03F 1/3282; H03F 2201/3233; H03F 2201/3224; H03F 1/304; H03F 1/3241; H04L 25/03044; H04B 1/0475

USPC ......... 375/296, 297, 229, 232, 233; 330/149
See application file for complete search history.

(56) References Cited

U.S. PATENT DOCUMENTS 6,798,843 B1 * 9/2004 Wright .................. H03F 1/3241
330/149
8,537,041 B2 9/2013 Chandrasekaran et al.
8,982,995 B1 * 3/2015 Van Cai ............... H04B 1/0475
375/297
9,209,753 B2 12/2015 Xiao et al.
(Continued)

OTHER PUBLICATIONS

Dennis R. Morgan et al. "A generalized memory polynomial model for digital predistortion of RF power amplifiers". IEEE Transactions on Signal Processing, Oct. 2006, pp. 3852-3860 ,vol. 54, No. 10.
(Continued)

*Primary Examiner* — Phuong Phu
(74) *Attorney, Agent, or Firm* — Sughrue Mion, PLLC

(57) ABSTRACT

A DPD operates at a sampling rate at which the input signal not up sampled at an upstream of the DPD is sampled. The DPD includes a polynomial structure comprising a pseudo-interpolation and sub-sample shift processing unit configured to pseudo-interpolate a sample point between the sample points of the input signal and shift the pseudo-interpolated sample point by a sub-sample, and an FIR (Finite Impulse Response) filter disposed at a downstream of the polynomial structure and including a sub-sample delay filter configured to delay the sample point of the input signal by the sub-sample. The DPD uses the polynomial structure and the FIR filter to compensate distortion by the sample point of the input signal and also compensate distortion by a sub-sample point between the sample points of the input signal for the digital predistorter.

10 Claims, 16 Drawing Sheets

(56) References Cited

U.S. PATENT DOCUMENTS

| | | | | |
|---|---|---|---|---|
| 9,866,414 | B2* | 1/2018 | Kim | H03F 1/304 |
| 2005/0195919 | A1* | 9/2005 | Cova | H03F 1/3258 |
| | | | | 375/297 |
| 2008/0285640 | A1* | 11/2008 | McCallister | H04L 25/03044 |
| | | | | 375/233 |
| 2013/0251065 | A1* | 9/2013 | Bai | H03F 1/3247 |
| | | | | 375/296 |

OTHER PUBLICATIONS

"3rd Generation Partnership Project; Technical Specification Group Radio Access Network; Study on new radio access technology: Radio Frequency(RF) and co-existence aspects", 3GPP TR 38.803, V14.1.0 Technical Report, Annex A: PA models, Release 14, Jun. 2017, pp. 1-202.

Vincent W. Leung et al. "Improved Digital-IF Transmitter Architecture for Highly Integrated W-CDMA Mobile Terminals", IEEE Transactions on Vehicular Technology, Jan. 2005, pp. 20-32, vol. 54, No. 1.

Ying Liu et al. "A New Digital Predistortion for Wideband Power Amplifiers With Constrained Feedback Bandwidth," IEEE Microwave and Wireless Components Letters, Dec. 2013, pp. 683-685, vol. 23, No. 12.

* cited by examiner

DISTORTION COMPENSATION APPARATUS AND DISTORTION COMPENSATION METHOD

INCORPORATION BY REFERENCE

This application is based upon and claims the benefit of priority from Japanese patent application No. 2018-003715, filed on Jan. 12, 2018, the disclosure of which is incorporated herein in its entirety by reference.

TECHNICAL FIELD

The present disclosure relates to a distortion compensation apparatus and a distortion compensation method for compensating distortion of a power amplifier in a transmission apparatus such as a base station used in a wireless communication system.

BACKGROUND ART

A transmission apparatus in a wireless communication system includes a power amplifier for amplifying power of transmission signals. The power amplifier is required to operate in a region as close to saturation as possible in order to improve the power efficiency. However, the relationship between the linearity and the power efficiency of the power amplifier is trade-off. Thus, the transmission apparatus includes a distortion compensation apparatus in order to simultaneously improve the linearity and the power efficiency. The distortion compensation apparatus is used for the purpose of suppressing non-linear distortion generated in the power amplifier during a high efficiency operation and for lowering an ACLR (Adjacent Channel Leakage Ratio) due to the non-linear distortion outside a band (out-of-band) and an EVM (Error Vector Magnitude) due to non-linear distortion inside the carrier band (in-band).

One scheme used in the distortion compensation apparatus is a DPD (Digital Predistortion) scheme. A distortion compensation apparatus of the DPD system adds in advance a signal having an inverse characteristic of a non-linear distortion of a power amplifier to an input signal of the power amplifier to improve the linearity of the output signal of the power amplifier to thereby suppress output distortion.

The output distortion of the power amplifier includes not only distortion due to memoryless non-linearity that depends only on an input signal at a certain time but also distortion due to a memory effect which occurs because of a bias current and an input signal at the timing shifted from the input signal at the certain time. Furthermore, the memory effect of the power amplifier becomes more noticeable as the bandwidth of the input signal increases, which limits the performance of the DPD.

Proposed specific signal processing performed by the DPD to compensate the distortion due to the memory effect include inverse distortion generation processing based on series-based methods such as Volterra Series, Memory Polynomial, and Generalized Memory Polynomial.

The DPD based on the Volterra series has a problem that it is highly difficult to implement it on actual hardware, because the complexity of the DPD increases exponentially in some cases. In order to address this problem, for example, NPL (Non Patent Literature) 1 (D. R. Morgan, Z. Ma, J. Kim, M. G. Zierdt, and J. Pastalan, "A generalized memory polynomial model for digital predistortion of RF power amplifiers", IEEE Transactions on Signal Processing, vol. 54, no. 10, pp. 3852-3860, October 2006) and NPL 2 (3GPP TR 38.803, V14.1.0 (2017-June), Technical Report, "3rd Generation Partnership Project; Technical Specification Group Radio Access Network; Study on new radio access technology: Radio Frequency (RF) and co-existence aspects", Annex A: PA models) propose a memory polynomial structure and a generalized memory polynomial structure. The memory polynomial structure is a simplified Volterra series for the purpose of minimizing a coefficient amount that is in a trade-off relationship with compensation performance. The generalized memory polynomial structure generalizes and extends a time shift amount of a memory effect term for an input signal at a certain time not only to a lagging term but also to a leading term in order to improve the performance of the memory polynomial structure.

As hardware for achieving the memory polynomial model and the generalized memory polynomial structure, commonly, a signal processing apparatus that performs a calculation equivalent to a power series using a look-up table (LUT) has been proposed. Further, for example, NPL 2 proposes a generalized memory polynomial model representing a specific non-linear model of a power amplifier based on an actual measurement or a circuit simulation. However, in the generalized memory polynomial model disclosed by NPL 2, it is necessary to derive an inverse system for an extremely large number of non-linear model coefficients, at the maximum of 8 (non-linear order: 0 to 7)×7(memory order: 7)×2 (I phase Q phase: 2)=112. Thus, the generalized memory polynomial model disclosed by NPL 2 has a problem in which even when signal processing is performed based on a simplified generalized memory polynomial structure, an extensive amount of the calculation is still required, which is a first problem in the related art.

Next, a problem involved in changes in technology trends will be described.

3rd Generation Partnership Project (3GPP) has been studying standardization of the preceding release 5G (5th Generation) Phase 1 in order to achieve large capacity communication in a 5G wireless communication system. However, even in 5G Phase 1, it is required to widen the band from 5 times to 20 times larger than that of the existing 4G (4th Generation). In particular, 800 MHz is required as the maximum system bandwidth in the quasi-millimeter wave/millimeter wave band.

In 5G Phase 1, it is agreed to aggregate carriers by the same Intra-band Contiguous Carrier Aggregation to achieve the system band of 800 MHz in the quasi-millimeter wave/millimeter wave band. For example, eight carriers each having a channel bandwidth (Ch BW: Channel Bandwidth) of 100 MHz with a sub-carrier spacing (SCS) of 60 kHz, the number of sub-carriers 1500 to 1584, and an FFT size of 2048 could be aggregated. Alternatively, four carriers each having a channel bandwidth of 200 MHz with a sub-carrier spacing of 60 kHz, the number of sub-carriers 3000 to 3168, and an FFT size of 2048 could be aggregated. Further alternatively, two carriers each having a channel bandwidth of 400 MHz with a sub-carrier spacing of 120 kHz, the number of sub-carriers of 3000 to 3168, and an FFT size of 4096 could be aggregated. However, when the system band 800 MHz is achieved by aggregating carriers by the same in-band continuous carrier aggregation as described above, an operation at an extremely high sampling frequency of 983.04 MHz is required in order to process the baseband signal in a total of 800 MHz band after the carriers are aggregated, even when the distortion is not compensated.

For example, when the above processing of the baseband signal is achieved by an FPGA (Field Programmable Gate Array), the maximum operating frequency (called Fmax.)

exceeding 1 GHz in the FPGA is a prospective value that can be reached in the next 7 nm or 5 nm onward, which will be released in the future. Thus, under the condition in which the FPGA of the current process is used, it is necessary to employ a two-phase poly-phase structure also for the operation at 983.04 MHz when the above-mentioned distortion compensation is not performed, and to operate a chain of each phase at ½ of the above sampling frequency of 983.04 MHz.

In a trend of 5G standardization for quasi-millimeter wave/millimeter wave band, 3GPP has been discussing to introduce a scale for ACLR of a BS (Base Station) and ACIR (Adjacent Channel Interference Ratio) by ACS (Adjacent Channel Selectivity of UE (User Equipment) to loosen the ACLR standard for the BS. As a result, 3GPP has agreed at the present time that the ACLR standard of the BS in the frequency band of 24 GHz or higher is loosened to 28 dBc (24.24 to 33.4 GHz band) and 26 dBc (37 to 52.6 GHz band). For this reason, there is a possibility of achieving the system band of 800 MHz only for the ACLR standard due to non-linear distortion outside the carrier band (out-of-band) in the quasi-millimeter wave/millimeter wave band even when the distortion compensation is not to be performed.

However, the influence on the EVM (error vector amplitude) remains in terms of the non-linear distortion within the carrier band (in-band). In order to satisfy the EVM standard 3.5% at the time of 256 QAM (Quadrature Amplitude Modulation) including an influence of phase noise of a local (locally oscillated) signal for a radio circuit in the quasi-millimeter wave/millimeter wave band and EVM degradation involved in an influence of a signal peak factor reduction signal of a signal, it is necessary to achieve roughly 40 dBc as an SNR (Signal to Noise Ratio) distribution by non-linear distortion within the carrier band. Thus, in particular, distortion compensation for compensating the non-linear distortion within the carrier band is required.

When the distortion is compensated, commonly, k-order non-linearity generates a distortion component occupying a bandwidth k times as large as a modulation bandwidth of an input signal (=a maximum frequency of an amplitude envelope change of the input signal). For this reason, a DPD that compensates this distortion component over the entire band needs to operate at a sampling frequency k times the modulation band of the input signal. For example, an operating frequency (a sampling frequency) of approximately 4 GHz is required for a DPD that compensates for up to fifth order non-linearity for a input signal band of 800 MHz in the quasi-millimeter wave/millimeter wave band. Further, even when the compensation is limited to third order non-linearity, an operating frequency of approximately 2.4 GHz is required for a DPD. Therefore, the system requirement for the operating frequency of the DPD exceeds the performance trend of an achieved device, which is a second problem in the related art.

Next, specific problems of the related art will be described with reference to the drawings.

FIG. 8 is a block diagram showing a configuration of the distortion compensation apparatus according to the related art in the transmission apparatus.

As shown in FIG. 8, the distortion compensation apparatus includes a DPD (digital predistorter) 1, a DA (digital-to-analog) converter 2, a transmission upconverter 3, a power amplifier 4, a directional coupler 5, a feedback downconverter 6, an AD (analog-to-digital) converter 7, and an interpolation circuit 8.

An input signal (a baseband signal) x(n) of the distortion compensation apparatus is upsampled by the interpolation circuit 8 at the upstream of the DPD 1, and the upsampled $x_u(n)$ is input to the DPD 1. The upsampling by the interpolation circuit 8 increases a sampling rate (a sampling frequency) of the input signal x(n) to expand a band of a digital signal for distortion compensation in the DPD 1. It is determined how many times higher the operating frequency (the sampling frequency) of the DPD 1 should be than the modulation band of the input signal x(n) based on a multiplication factor of the upsampling by the interpolation circuit 8.

Note that the technique of up sampling an input signal of the DPD at the upstream of the DPD and outputting the upsampled signal to the DPD is disclosed in, for example, U.S. Pat. Nos. 9,209,753 and 8,537,041. Hereinafter, the distortion compensation apparatus for up sampling the input signal of the DPD at the upstream of the DPD is referred to as an upsampling distortion compensation apparatus as appropriate. In the upsampling distortion compensation apparatus, the DPD for inputting the upsampled input signal at the upstream thereof is referred to as an upsampling DPD as appropriate.

For example, assume that the $x_u(n)$, which has been up sampled by the interpolation circuit 8 twice the original sampling rate for the sampling frequency 983.04 MHz, which is necessary for processing the above-described input signal x(n) in the 800 MHz band in the quasi-millimeter wave/millimeter wave band, is input to the DPD 1. In this case, the operating frequency of the DPD 1, i.e., the band of the digital signal for distortion compensation, is 1.96608 GHz, which is 2.4576 times the band 800 MHz of the input signal x(n).

The DPD 1 performs processing (distortion compensation processing) for generating $y_u(n)$, in which a signal having an inverse characteristic of the non-linear distortion of the power amplifier 4 is added in advance to the input upsampled $x_u(n)$, and then outputs the generated $y_u(n)$ to the DA converter 2. Details of the DPD 1 will be described later.

The DA converter 2 converts the output signal $y_u(n)$ of the DPD 1 from a digital signal to an analog signal, and outputs the converted analog signal to the transmission upconverter 3.

The transmission upconverter 3 upconverts the analog signal from the DA converter 2 to an RF (Radio Frequency) signal, and outputs the upconverted RF signal to the power amplifier 4.

The directional coupler 5 feeds back a part of the RF signal amplified and output by the power amplifier 4 and outputs it as a feedback RF signal for an output observation. The feedback RF signal obtained by the directional coupler 5 is fed back to the DPD 1 via the feedback downconverter 6 and the AD (analog-to-digital) converter 7.

The feedback downconverter 6 downconverts the feedback RF signal from the directional coupler 5, and outputs the downconverted signal to the AD converter 7.

The AD converter 7 converts the signal from the feedback downconverter 6 from an analog signal to a digital signal, and feeds back the converted digital signal as a feedback signal $z_u(n)$ to the DPD 1.

The DPD 1 performs the distortion compensation processing using the feedback signal $z_u(n)$ from the AD converter 7. Specifically, the DPD 1 includes an LUT, and updates the LUT according to the feedback signal $z_u(n)$. Then, in the distortion compensation processing, the DPD 1 calculates a signal having an inverse characteristic of the non-linear distortion of the power amplifier 4 using the updated LUT, and adds the calculated signal to $x_u(n)$ to thereby generate $y_u(n)$. Details of the LUT will be described later.

Recently, an interpolation DAC is used (hereinafter, the DA converter 2 is referred to as an interpolation DA converter 2 as appropriate) as the DA converter 2 in FIG. 8 for the purpose of eliminating the need to correct an image due to a DC offset and a quadrature error resulting from imperfection of an analog quadrature modulator and for simplifying a radio circuit. The interpolation DA converter is a DA converter that incorporates an interpolation function and a Digital Quadrature Modulator function.

Note that the above-described interpolation DA converter is used not only for the purpose of achieving the above digital quadrature modulation but also as a DA converter even when digital orthogonal modulation is not performed. For example, the above-described interpolation DA converter can alleviate the performance requirement of an analog filter that is necessary for an output part of the DA converter. The above-described interpolation DA converter is commonly used not only as a discrete DA converter but also as a DA converter incorporated in general-purpose ICs for specific applications requiring miniaturization and integration for the purpose of performing over sampling which exerts a miniaturizing effect.

For example, NPL 3 (V. Leung, and L. Larson, "Improved Digital-IF Transmitter Architecture for Highly Integrated W-CDMA Mobile Terminals", IEEE Transactions on Vehicular Technology, vol. 54, no. 1, pp. 20-32, January 2005) disclose the above-described digital orthogonal modulation scheme.

FIG. 9 is a block diagram showing a function example of the interpolation DA converter 2.

The interpolation DA converter 2 is configured to achieve the digital quadrature modulation function in a manner described below. First, the interpolation DA converter 2 is operated at a sampling clock rate four times the sampling frequency of input I and Q signals to interpolate each of the input I and Q signals to four times the sampling frequency. A complex multiplier 206 complex-multiplies the I signal interpolated to four times the sampling frequency by a sine signal for an I phase (e.g., 0, 1, 0, −1, 0, . . . ) from a NCO (Numerical Controlled Oscillator) 205. A complex multiplier 207 complex-multiplies the Q signal interpolated to four times the sampling frequency by a cosine signal for a Q phase (e.g., 1, 0, −1, 0, 1, . . . ) from the NCO 205. Then, the signals complex-multiplied by the complex multipliers 206 and 207 are added by an adder 208 to obtain a digital quadrature modulated signal. After that, this digital quadrature modulated signal is converted into an analog signal by one (single channel) DA converter 209. Then, a quadrature modulated real IF signal having an IF (Intermediate Frequency) frequency of ¼ the sampling clock rate of the interpolation DA converter 2 is output.

Here, the interpolation DA converter 2 includes two stages of 2× interpolation circuits for performing zero-stuffing on an input signal of each stage, and then eliminating an image with a half-band filter for interpolation to thereby achieve a 4-fold interpolation function.

The above half-band filter is used when an application for processing multirate signals interpolates the multirate signal to twice the original sampling rate or decimates the multirate signal to ½ the original sampling rate. The above half-band filter is implemented in a polyphase form, because about half of the coefficients are equal to zero.

The interpolation DA converter 2 incorporates, as an upstream (first stage) 2× interpolation circuit, a half-band filter$_1$ 201 and a half-band filter$_1$ 202 for the first stage 2× interpolation, and as a downstream (second stage) interpolation circuit, a half-band filter$_2$ 203 and a half-band filter$_2$ 204 for the downstream 2× interpolation circuit. These half-band filters are for interpolation of 80% a Nyquist passband. Commonly, the half-band filter$_1$ 201 and the half-band filter$_1$ 202 for the first stage 2× interpolation are FIR (Finite Impulse Response) filters of about 59 taps, and the half-band filter$_2$ 203 and the half-band filter$_2$ 204 for the downstream 4× interpolation are FIR filters of about 23 taps.

By employing the interpolation DA converter 2, the transmission upconverter 3 at the downstream of the interpolation DA converter 2 only needs to convert the real IF signal output from the interpolation DA converter 2 into an RF signal, which eliminates the need for an analog quadrature modulator. Thus, when the interpolation DA converter 2 is employed, it is possible to achieve an effect in which a radio circuit can be simplified, and processing for correcting an image due to a DC offset and a quadrature error resulting from imperfection of an analog quadrature modulator can be deleted.

In the distortion compensation apparatus according to the related art shown in FIG. 8, assume that the interpolation circuit 8 is deleted and the upsampling for the DPD 1 is not performed for the purpose of reducing the operating frequency of the DPD 1 itself in order to address the above-described second problem concerning the device performance. With this configuration, as shown in FIG. 14 (a detailed description will be given later), for example, the operating frequency of the DPD 1 for the input signal band of 800 MHz in the quasi-millimeter wave/millimeter wave band remains as 983.04 MHz, which is necessary for processing the above-described input signal x(n) in the 800 MHz band and which is only 1.2288 times the band of the input signal x(n).

Next, it will be described how difficult it is to achieve a configuration in which the interpolation circuit 8 is deleted as assumed above with reference to the related art for a comparison.

Commonly, the AD converter has a relatively lower sampling rate than that of the DA converter, and becomes a rate-limiting factor in terms of performance. Thus, for example, NPL 4 (Y. Liu, W. Pan, S. Shao, and Y. Tang, "A New Digital Predistortion for Wideband Power Amplifiers With Constrained Feedback Bandwidth," IEEE Microwave and Wireless Components Letters, vol. 23, no. 12, pp. 683-685, December 2013) propose a DPD scheme capable of narrowing the bandwidth of the feedback path in which the AD converter is disposed in order to reduce the request for the AD converter for the purpose of reducing the cost of the distortion compensation apparatus.

NPL 4 propose, as shown in FIG. 1, a DPD scheme that can reduce the sampling frequency of the AD converter for the feedback path to 368.64 MHz by limiting the feedback signal for the output observation of the power amplifier to a narrow band of 100 MHz by a BPF (Band-Pass Filter) for an input signal having a modulation band of 100 MHz. However, in the technique disclosed by NPL 4, the DPD is operated at a sampling frequency of 3.68 times the band of the input signal.

On the other hand, for example, U.S. Pat. No. 9,209,753 proposes the Band-Limited Volterra Series-Based DPD scheme as means for reducing the sampling frequency of the AD converter for the feedback path, the DA converter for transmission, and the sampling frequency of the DPD for the purpose of further reducing the cost of the distortion compensation apparatus.

In the technique disclosed in U.S. Pat. No. 9,209,753, the DPD based on a Band-Limited Volterra Series model generates a distortion compensation signal for an input signal having a modulation band of 100 MHz. Further, distortion outside the band of the filter that limits the band of the distortion compensation signal generated by this DPD is suppressed by the BPF of the related art disposed at the output part of the power amplifier. U.S. Pat. No. 9,209,753 proposes the DPD scheme capable of reducing the sampling frequency of the DPD from 500 MHz of the related art to 200 MHz with this configuration. However, in the technique disclosed in U.S. Pat. No. 9,209,753, the DPD is operated at a sampling frequency twice the bandwidth of the input signal.

In the technique disclosed in U.S. Pat. No. 9,209,753, a non-linear processing unit is provided at an upstream of a bandwidth limitation unit that limits the band of the distortion compensation signal within a pre-set bandwidth. It is necessary for the non-linear processing unit to generate high order non-linear distortion and a high order memory effect for compensation, which has not yet been limited, to be output within the limited band based on a Volterra Series parameter. In order to do so, although the sampling frequency of the hardware of the non-linear processing unit is reduced to 200 MHz in the non-linear processing unit, a high-speed operation is required for a calculation processor of the non-linear processing unit (which is not explicitly described in U.S. Pat. No. 9,209,753, though). For example, assume that high order non-linear distortion and a high order memory effect that make the compensation performance within the limited band equal to the compensation performance at the 500 MHz sampling of the related art are generated. In such a case, it is necessary to operate a processor for non-linear processing calculation achieved by a microprocessor or an embedded processor such as a CPU at a frequency five times the band of the input signal.

Furthermore, U.S. Pat. No. 8,537,041 proposes a DPD subsystem that can improve a distortion compensation characteristic without increasing a sampling rate of an AD converter for a feedback path and a DA converter for transmission as compared with the related art.

The technique disclosed in U.S. Pat. No. 8,537,041 includes, in the DPD subsystem, a DPD main body, an interpolation circuit disposed as a Pre-DPD Processor at an upstream of the DPD main body, and a decimation circuit disposed as a post-DPD processor at a downstream of the DPD main body. With this configuration, the sampling rates of the input and the output of the DPD subsystem do not apparently change from those of the related art, and the sampling rates of the AD converter for the feedback path and the DA converter for the transmission can be made the same as those of the related art. However, as described above, the interpolation circuit is provided in the DPD subsystem in practice. Therefore, the technique disclosed in U.S. Pat. No. 8,537,041 is nothing other than a technique of operating the DPD main body at a sampling frequency twice the rate of the input signal even when an interpolation factor L is the lowest 2.

Moreover, it can be said that the technique disclosed in U.S. Pat. No. 8,537,041 is about a band-limiting DPD in which the processing, which is performed by the processor for non-linear processing calculation disclosed in U.S. Pat. No. 9,209,753 in order to limit the band after the high order non-linear distortion and the high order memory effect are generated in the technique disclosed in U.S. Pat. No. 9,209,753, is replaced with a hardware interpolation circuit and a decimation circuit.

As described above, for example, in order to perform distortion compensation on the input signal (baseband) in the 800 MHz band in the quasi-millimeter wave/millimeter wave band, the operating frequency of the DPD needs to be 1.6 GHz, which is twice the input signal band 800 MHz even in the technique disclosed in U.S. Pat. No. 9,209,753. Likewise, the operating frequency of the DPD needs to be 1.966 GHz, which is 2.4576 times the input signal band 800 MHz (the rate of the input signal 983.04 MHz×2) in the technique disclosed even in U.S. Pat. No. 8,537,041.

Next, in order to show the distortion compensation performance of the related art which is to be a reference, a distortion compensation characteristic of the upsampling distortion compensation apparatus shown in FIG. 8 including the 2× interpolation circuit 8 at the upstream of the DPD 1 for an input signal (=input signal rate 983.04 MHz) in the 800 MHz band in the quasi-millimeter wave/millimeter wave band will be described using a specific non-linear model of a power amplifier.

The input signal (the baseband signal) x(n) of the distortion compensation apparatus shown in FIG. 8 is upsampled by the interpolation circuit 8 at the upstream of the DPD 1, and the upsampled $x_u(n)$ is input to the DPD 1. The up sampling by the interpolation circuit 8 increases the sampling rate (the sampling frequency) of the input signal x(n) and expands the digital signal band for the distortion compensation in the DPD 1. In this example, the upsampling ratio by the interpolation circuit 8 is twice as high as the original sampling rate, and the operating frequency of the DPD 1 is set to the rate of the input signal of 983.04 MHz×2=1.96608 GHz. The operating frequency of the DPD 1 at this time is equal to 2.4576 times the band 800 MHz of the input signal x(n).

In the DPD 1, $y_u(n)$ is generated by adding in advance a signal having an inverse characteristic of the non-linear distortion of the power amplifier 4 to the input up sampled $x_u(n)$.

In the DPD 1, when the generalized memory polynomial structure is applied, the output signal $y_u(n)$ of the DPD 1 is a result of calculating the following equation (1) for the upsampled input signal $x_u(n)$ of the DPD 1.

$$y_u(n) = \sum_{l=-\frac{L-1}{2}}^{+\frac{L-1}{2}} \sum_{k=0}^{K-1} x_u(n-l) \cdot a_{l,k} \cdot |x_u(n-l)|^k \qquad (1)$$

Here, a time shift amount l of a memory effect term in the equation (1) is a time shift amount (i.e., a sample shift amount) in the unit of a sampling cycle (=1/sampling frequency) of the output signal $y_u(n)$ of the DPD 1. Furthermore, in the generalized memory polynomial, the above-mentioned time shift amount for an input signal at a certain sample timing is generalized and expanded to not only a lagging term but also a leading term. For that reason, l can be any value from $$-\frac{L-1}{2}$$

to $$+\frac{L-1}{2}.$$

Note that L is referred to as a memory order or the number of memory taps. Thus, hereinafter, the time shift amount 1 of the memory effect term is referred to as a memory tap for convenience.

When the power series calculation for each term of the memory tap 1 in the equation (1) which is:

$$\sum_{k=0}^{K-1} a_{l,k} \cdot |x_u(n-l)|^k$$

is achieved by a power series function of:

$$K_l(|x_u(n-l)|)$$

which is for an amplitude of each term of the memory tap 1 by a hardware LUT (Look Up Table) instead of a direct calculation by a calculation processor, the equation (1) can be expressed by the following equation (2).

$$y_u(n) = \sum_{l=-\frac{L-1}{2}}^{+\frac{L-1}{2}} \sum_{k=0}^{K-1} x_u(n-l) \cdot a_{l,k} \cdot |x_u(n-l)|^k = \sum_{l=-\frac{L-1}{2}}^{+\frac{L-1}{2}} x_u(n-l) \cdot K_l(|x_u(n-l)|) \quad (2)$$

In the term of l=0 in the equation (2), the time shift amount of the output signal of the DPD 1 for the input signal of the DPD 1 becomes zero. Thus, the polynomial at l=0 corresponds to a memoryless polynomial.

When, specifically, L=7 is given and the substitution is performed like $l=l_s-3$ for the time shift amount 1 is in the equation (2), the equation (2) can be expressed by the following equation (3).

$$y_u(n) = \sum_{l=-3}^{+3} x_u(n-l) \cdot K_l(|x_u(n-l)|) = \sum_{l_s=0}^{6} x_u(n+3-l_s) \cdot K_{l_s}(|x_u(n+3-l_s)|) \quad (3)$$

When n in the above equation (3) is delayed by three samples, it can be expressed by the following equation (4).

$$y_u(n-3) = \sum_{l_s=0}^{6} x_u(n-l_s) \cdot K_{l_s}(|x_u(n-l_s)|) \quad (4)$$

In the term of $l_s=3$ (i.e., l=0) in the equations (3) and (4), the time shift amount of the output signal of the DPD 1 for the input signal of the DPD 1 becomes zero. Thus, the polynomial at $l_s=3$ corresponds to the memoryless polynomial.

FIG. 10 shows a block diagram when the calculation of the above equation (4) in the DPD 1 according to the related art is achieved by, for example, a hardware function.

The DPD 1 in FIG. 10 achieves the calculation of the above equation (4). The DPD 1 in FIG. 10 includes one-sample delay devices 301a, 301b, 301c, 301d, 301e, and 301f, amplitude address calculation circuits 302a, 302b, 302c, 302d, 302e, 302f, and 302g, and LUTs (lookup tables) 303a, 303b, 303c, 303d, 303e, 303f, and 303g, complex multipliers 304a, 304b, 304c, 304d, 304e, 304f, and 304g, and an adder 305. The specific description of FIG. 10 is omitted.

When the equation (4) and the configuration of FIG. 10 are applied, assuming that the non-linear order is 0 to 7 and the memory order (the number of memory taps) is 7, it is necessary to derive the inverse system for 8×7×2=112 non-linear model coefficients as complex coefficients (of the I phase and Q phase).

In order to address the first problem in the related art in which an extensive amount of calculation is required, a method of expressing the seventh-order memory polynomial model achieving the above equation (4) and FIG. 10 by an approximate model that combines a three-tap polynomial and a 5-tap FIR filter is introduced to reduce the coefficient amount.

There is no example about the method based on this approximate model disclosed in the documents and the like regarding the related art. However, this method using the approximate model can be regarded as an extended configuration from the related art. The method using the approximate model includes three of the Wiener-Hammerstein models shown in FIG. 2(c) of NPL 1 connected in parallel.

The above equation (2) is transformed into an approximate model based on a combination of a polynomial having a reduced coefficient amount and the FIR filter, and is expressed by the following equation (5). In this equation, it is assumed that L (the memory order) is lower than 7 given by the equation (3) before the coefficient amount is reduced.

$$y_u(n) = \sum_{l=-\frac{L-1}{2}}^{+\frac{L-1}{2}} \sum_{r=-\frac{R-1}{2}}^{+\frac{R-1}{2}} W_{l,r} \cdot x_u(n-l-r) \cdot K_l(|x_u(n-l-r)|) \quad (5)$$

Like the above equation (2), in the terms of l=0 and r=0 in the equation (5), the time shift amount of the output signal of the DPD 1 for the input signal of the DPD 1 becomes zero. Thus, the polynomial at l=0 and r=0 corresponds to the memoryless polynomial.

When, specifically, L=3 taps and R=5 taps are given to the above equation (5) in order to reduce the coefficient amount, the equation (5) can be expressed by the following equation (6).

$$y_u(n) = \sum_{l=-1}^{+1} \sum_{r=-2}^{+2} W_{l,r} \cdot x_u(n-l-r) \cdot K_l(|x_u(n-l-r)|) \quad (6)$$

Furthermore, when the time shift amount 1 is substituted as in $l=l_s-1$, and r is substituted as in $r=r_s-2$ for r, the equation (6) can be expressed by the following equation (7).

$$y_u(n) = \sum_{l_s=0}^{2} \sum_{r_s=0}^{4} W_{l_s,r_s} \cdot x_u(n+3-l_s-r_s) \cdot K_{l_s}(|x_u(n+3-l_s-r_s)|) \quad (7)$$

When n in the equation (7) is delayed by 3 samples, it can be expressed by the following equation (8).

$$y_u(n-3) = \sum_{l_s=0}^{2}\sum_{r_s=0}^{4} W_{l_s,r_s} \cdot x_u(n-l_s-r_s) \cdot K_{l_s}(|x_u(n-l_s-r_s)|) \quad (8)$$

In the terms of $l_s=1$ (i.e., $l=0$) and $r_s=2$ (i.e., $r=0$) in the equations (7) and (8), the time shift amount of the output signal of the DPD 1 for the input signal of the DPD 1 becomes zero. Thus, the polynomial at $l_s=1$ and $r_s=2$ corresponds to the memoryless polynomial.

FIG. 11 shows a block diagram when the calculation of the above equation (8) with the reduced coefficient amount in the DPD 1 is composed of, for example, a hardware function.

The DPD 1 in FIG. 11 achieves the calculation of the above equation (8). The DPD 1 in FIG. 11 includes one-sample delay devices 401a and 401b, amplitude address calculation circuits 402a, 402b, and 402c, LUTs 403a, 403b, and 403c, complex multipliers 404a, 404b, and 404c, an FIR filter$_0$ 405a and an FIR filter$_1$ 405b, an FIR filter$_2$ 405c, and an adder 406. Furthermore, each of the FIR filter$_0$ 405a, the FIR filter$_1$ 405b, and the FIR filter$_2$ 405c includes one-sample delay devices 411a, 411b, 411c, and 411d, complex multipliers 412a, 412b, 412c, 412d, and 412e, and an adder 413.

In FIG. 11, to make descriptions simple, the polynomial in which the coefficient amount is reduced in the outputs of the complex multipliers 404a, 404b, and 404c for each term of the memory tap $l_s$ of the above equation (8), which is:

$$x_u(n-l_s) \cdot K_{l_s}(|x_u(n-l_s)|)$$

is substituted by the function $d_u(n-l_s)$ as shown in the following equation (9).

$$x_u(n-l_s) \cdot K_{l_s}(|x_u(n-l_s)|) = d_u(n-l_s) \quad (9)$$

The one-sample delay devices 401a and 401b generate, from the up sampled input signal $x_u(n)$ of the DPD 1 at a certain sample timing, $x_u(n)$, $x_u(n-1)$, and $x_u(n-2)$ that are delayed each by one sample. The amplitude address calculation circuits 402a, 402b, and 402c calculate, for the respective signals of $x_u(n)$, $x_u(n-1)$, $x_u(n-2)$ that are delayed each by one sample, LUT amplitude addresses corresponding to the amplitudes $|x_u(n)|$, $|x_u(n-1)|$, and $|x_u(n-2)|$ of the respective signals. The LUTs 403a, 403b, and 403c are referred to based on the LUT amplitude addresses for the respective signals each delayed by one sample, and output signals of the respective LUTs corresponding to the LUT amplitude addresses are obtained. Then, the output signals of the respective LUTs are complex-multiplied by the respective signals each delayed by one sample by the complex multipliers 404a, 404b, and 404c. The results of the complex multiplications performed by the complex multipliers 404a, 404b, and 404c are input to the FIR filter$_0$ 405a, the FIR filter$_1$ 405b, and the FIR filter$_2$ 405c as the polynomial $d_u(n-l_s)$ with the reduced coefficient amount for each term of the memory taps $l_s=0$, 1, and 2. The FIR filter$_0$ 405a corresponds to the memory tap $l_s=0$. The FIR filter$_1$ 405b corresponds to the memory tap $l_s=1$. The FIR filter$_2$ 405c corresponds to the memory tap $l_s=2$.

The FIR filter$_0$ 405a, the FIR filter$_1$ 405b, and the FIR filter$_2$ 405c generate $d_u(n-l_s)$, $d_u(n-l_s-1)$, $d_u(n-l_s-2)$, $d_u(n-l_s-3)$, and $d_u(n-l_s-4)$, which are delayed each by one sample by the one-sample delay devices 411a, 411b, 411c, and 411d, from $d_u(n-l_s)$ input to the respective FIR filters. The complex multipliers 412a, 412b, 412c, 412d, and 412e complex-multiply the respective signals each delayed one sample by the filter (complex) coefficients $W_{l_s,0}$, $W_{l_s,1}$, $W_{l_s,2}$, $W_{l_s,3}$, and $W_{l_s,4}$ corresponding to the FIR taps $r_s=(0, 1, 2, 3, 4)$, respectively. After that, the signals complex-multiplied by the complex multipliers 412a, 412b, 412c, 412d, and 412e are added by the adder 413. The signal added by the adder 413 is output from the FIR filter$_0$ 405a, the FIR filter$_1$ 405b, and the FIR filter$_2$ 405c as:

$$\sum_{r_s=0}^{4} W_{l_s,r_s} \cdot d_u(n-l_s-r_s)$$

for each memory tap $l_s$.

The output signal of the filter$_0$ 405a corresponding to the memory tap $l_s=0$ is as follows.

$$\sum_{r_s=0}^{4} W_{0,r_s} \cdot d_u(n-r_s)$$

The output signal of the FIR filter$_1$ 405b corresponding to the memory tap $l_s=1$ is as follows.

$$\sum_{r_s=0}^{4} W_{1,r_s} \cdot d_u(n-1-r_s)$$

The output signal of the FIR filter$_2$ 405c corresponding to the memory tap $l_s=2$ is as follows.

$$\sum_{r_s=0}^{4} W_{2,r_s} \cdot d_u(n-2-r_s)$$

The output signals of the FIR filter$_0$ 405a, the FIR filter$_1$ 405b, and the FIR filter$_2$ 405c are eventually added by the adder 406, and the added signal is output from the DPD 1 as the polynomial in which the coefficient amount is reduced expressed by the above equation (8).

When the equation (8) and the configuration of FIG. 11 are applied, assuming that the non-linear order is 0 to 7, the memory order (the number of memory taps) is 3, and the number of FIR taps is 5, the inverse system for $(8+5)\times 3\times 2=78$ non-linear model coefficients may be derived as the (I phase and Q phase) complex coefficients. Thus, it is possible to reduce the coefficient amount by 30% compared with the case when the above-described equation (4) and configuration of FIG. 10 are applied (where the coefficient amount is 112).

The $(8\times 3\times 2=48)$ power series coefficients and the $(5\times 3\times 2=30)$ tap coefficients of the FIR filter$_0$ 405a, the FIR filter$_1$ 405b, and the FIR filter$_2$ 405c in the LUTs 403a, 403b, and 403c are derived as follows. That is, these power series coefficients and tap coefficients in the LUTs 403a, 403b, and 403c are derived by performing adaptive control with a ratio of an RMSE (Root Mean Square Error) of the input signal $x_u(n)$ in the feedback signal $z_u(n)$ of N samples to an RMS (Root Mean Square) value of the input signal $x_u(n)$ of the N samples of the DPD 1, which is to be a reference, as an error evaluation function.

As shown in the following equation (10), the above error evaluation function is an NRMSE (Normalized Root Mean Square Error), and is equivalent to an EVM (Error Vector Magnitude) of the feedback signal $z_u(n)$ for $x_u(n)$.

$$NRMSE = 20 \cdot \log_{10}\left(\frac{\sqrt{\frac{\sum_{n=1}^{N}|z_u(n)-x_u(n)|^2}{N}}}{\sqrt{\frac{\sum_{n=1}^{N}|x_u(n)|^2}{N}}}\right) = 10 \cdot \log_{10}\left(\frac{\sum_{n=1}^{N}|z_u(n)-x_u(n)|^2}{\sum_{n=1}^{N}|x_u(n)|^2}\right) \quad (10)$$

Next, the distortion compensation characteristic of the upsampling distortion compensation apparatus based on the interpolation circuit to which the above equation (8) and the configuration of FIG. 11 are applied for a specific non-linear model coefficient of the power amplifier is confirmed.

In this example, narrowing the channel bandwidth and increasing the number of carriers to aggregate to thereby increase a signal envelope change will be considered. Thus, a signal with a sampling frequency of 983.04 MHz, which is an aggregation of 10 carriers each having a channel bandwidth of 80 MHz with a sub-carrier spacing (SCS) of 60 kHz and the number of sub-carriers of 1200, is assumed as a signal having the system band of 800 MHz assumed in the quasi-millimeter wave/millimeter wave band. This signal shall be the input signal x(n) of the distortion compensation apparatus before being upsampled by the interpolation circuit 8 in FIG. 8. Further, the upsampling ratio by the interpolation circuit 8 is twice as high as the original sampling rate, and the upsampled signal input to the DPD 1 shall be $x_u(n)$. Furthermore, the operating frequency of the DPD 1 shall be 1.96608 GHz which is twice the rate 983.04 MHz of the input signal x(n).

As a specific non-linear model coefficient of the power amplifier, a power amplifier model coefficient by GaN (Gallium Nitride: Gallium nitride) for 28 GHz that is close to the above condition of the sampling frequency from among the generalized memory polynomial coefficients described by NPL 2, and in which the input/output data at the time of measuring the model is collected at the sampling rate of about 2 GHz is used. Commonly, the memory tap in the memory polynomial model is measured at the operating frequency (=the sampling rate) of the DPD employed, and the time shift amount of this memory tap is the time shift (sample shift) amount in units of the sampling cycle (=1/sampling rate) at the time of the measurement. This is because the sampling rate of the input/output data at the time of model measurement is an important index for selecting the number of memory taps (or the memory order) required for the DPD compensating the model.

First, FIG. 12 shows the distortion characteristic of the power amplifier model output for the interpolated upsampling signal when the DPD is not operated.

In the example of FIG. 12, the input signal x(n) having the system band of 800 MHz at the sampling frequency of 983.04 MHz is upsampled by a factor of 2 to make it 1.96608 GHz by the interpolation circuit 8. The characteristic shown in FIG. 12 is the output distortion characteristic of the power amplifier alone when this signal $x_u(n)$ upsampled by a factor of 2 is directly input, without operating the DPD, i.e., the above $x_u(n)$, to the generalized memory polynomial model of the power amplifier.

Under the operating condition of an output backoff of 9 dB, distortion outside the carrier band specified by the ACLR becomes lower than 28 dBc. However, an error from a carrier signal due to the distortion within the carrier band is higher than the out-of-band distortion by 5-10 dB. Thus, the compensation amount necessary for suppressing the distortion within the carrier band to the above-mentioned distribution target of 40 dBc that satisfies the EVM standard at 256 QAM is about 20 dB or more.

FIG. 13 shows the compensation characteristic by the upsampling DPD according to the related art.

In the example of FIG. 13, the input signal x(n) having the system band of 800 MHz at the same sampling frequency 983.04 MHz as that in FIG. 12 is upsampled by a factor of 2 to make it 1.96608 GHz by the interpolation circuit 8 at the upstream of the DPD 1. The signal $x_u(n)$ upsampled by a factor of 2 is used as the input signal of the DPD 1. The above equation (8) and the configuration of FIG. 11 are applied to perform adaptive control using the above equation (10) as the error evaluation function to operate the DPD 1. The characteristic shown in FIG. 13 is the distortion compensation characteristic by the double upsampling DPD in which the above coefficient amount is reduced by 30% obtained by inputting the output signal $y_u(n)$ of the DPD 1 at this time to the generalized memory polynomial model of the power amplifier.

With the double upsampling DPD, an error from a carrier signal due to distortion within a carrier band can be suppressed to an average value of 48.4 dBc as compared with an average value of 23.6 dBc when the DPD shown in FIG. 12 is not operated.

As described above, in order to address the first problem in the related art in which an extensive amount of calculation is required, the upsampling distortion compensation apparatus by the interpolation circuit to which the above equation (8) and the configuration of FIG. 11 are applied to reduce the coefficient amount may be introduced. According to the upsampling distortion compensation apparatus using this interpolation circuit, the coefficient amount can be reduced by 30% as compared with the DPD to which the above equation (4) and the configuration of FIG. 10 according to the related art are applied. Further, according to the upsampling distortion compensation apparatus using this interpolation circuit, as shown in FIG. 13, it can be seen that compensation performance for achieving the above target can be obtained both outside and within the carrier band.

However, in the upsampling distortion compensation apparatus using the interpolation circuit to which the equation (8) and the configuration of FIG. 11 are applied, as described above, the system requirement for the operating frequency of the DPD 1 exceeds the performance trend of an achieved device, because the interpolation circuit 8 at the upstream of the DPD 1 upsamples signals by a factor of 2 to make it 1.96608 GHz. For this reason, the above-mentioned second problem remains unsolved.

FIG. 14 is a block diagram of a distortion compensation apparatus in which the interpolation circuit 8 shown in FIG. 8 is deleted, and the upsampling for the DPD is not performed in order to address the second problem concerning the device performance in the distortion compensation apparatus according to the related art.

A difference between a configuration of FIG. 14 and that of the previously described FIG. 8 is that the input signal x(n), which has not been upsampled for the DPD along with the deletion of the interpolation circuit 8, is directly input to the DPD 1. Further, another difference between the configuration of FIG. 14 and that of FIG. 8 is that the sampling frequencies of the output signal y(n) and the input signal x(n) of the DPD 1 are the same, although the DPD 1 adds in advance a signal having an inverse characteristic of the non-linear distortion of the power amplifier 4 to the input x(n) to generate y(n) and outputs it.

With the configuration shown in FIG. 14, the operating frequency of the DPD 1 for the band 800 MHz of the input signal x(n) in the quasi-millimeter wave/millimeter wave band is 983.04 MHz, which is necessary for processing baseband input signals in the 800 MHz band, because the upsampling for the DPD is not performed. For this reason, the ratio of the operating frequency of the DPD 1 to the band of the input signal x(n) is 1.2288, which is less than that of the related art where the ratio of operating frequency of the DPD 1 to the band of the input signal x(n) is two.

Next, the problem in the distortion compensation apparatus having the configuration of FIG. 14 in which the interpolation circuit 8 is deleted, and the upsampling for the DPD is not performed will be described. The input signal x(n) in the 800 MHz band and the output signal y(n) of the DPD 1 in FIG. 14 are signals sampled at a sampling frequency of 983.04 MHz. The maximum frequency of the amplitude envelope change in the input signal x(n) having a modulation band of 800 MHz is 800 MHz. However, when the maximum frequency of the amplitude envelope change in the input signal x(n) is close to the sampling frequency, a change in the amplitude envelope of the signal interpolated by the interpolation DA converter 2 becomes deviated from a change in the amplitude envelope of the signal before interpolation.

FIG. 15 shows a comparison between an amplitude change of a signal in the 800 MHz band at the sampling frequency of 983.04 MHz before the interpolation and an amplitude change of a signal obtained by up sampling this signal by a factor of 2 through the 2× interpolation processing to make it 1.96608 GHz. Note that the 2× interpolation processing is performed by the first stage 2× interpolation circuit in the above-described interpolation DA converter 2 shown in FIG. 9 in which zero-stuffing is performed on an input signal, and then an image is eliminated by a half-band filter for interpolation.

The above 2× interpolation generates interpolated sample points between sample spacing of the signal before the interpolation. However, there are samples in which the amplitude envelope change of the double-interpolated signal largely deviates from the amplitude envelope change between the samples in the signal before the interpolation (in FIG. 15, the samples largely deviating are surrounded by double broken lines).

Next, FIG. 16 shows a comparison between an amplitude change of a signal upsampled by a factor of 2 to achieve the sampling frequency of 1.96608 GHz through the 2× interpolation processing and an amplitude change of a signal obtained by upsampling this signal by a factor of 4 to achieve the sampling frequency of 3.93216 GHz through another 2× interpolation processing. Note that the 2× interpolation processing added for upsampling the signal by a factor of 4 is performed by the 2× interpolation circuit at the downstream in the interpolation DA converter 2 shown in FIG. 9.

There is no big difference between the amplitude envelope change of the double-interpolated signal and the amplitude envelope change of the signal after 4× interpolation.

As described above, when the maximum frequency of the amplitude envelope change is close to the sampling frequency (e.g., the ratio of the sampling frequency to the input signal band is less than 2), it can be seen that the change in the amplitude envelope of the interpolated signal deviates from the change in the amplitude envelope of the signal before the interpolation.

As described above, when the interpolation circuit is deleted, and the upsampling for the DPD is not performed, there is a problem that the amplitude envelope change of the signal interpolated by the interpolation DA converter 2 at the downstream of the DPD 1 deviates from that of the signal before the interpolation to be processed by the DPD 1. It is unnecessary to consider this problem in the distortion compensation apparatus that employs the upsampling DPD 1 by interpolation according to the related art for upsampling a signal by a factor of 2 at the upstream of the DPD 1. This problem is to be solved only in the distortion compensation apparatus in which the upsampling for the DPD is not performed.

In FIG. 14, the DPD 1 generates the output signal y(n) of the DPD 1 having the same sampling frequency as that of the input signal x(n) by the input signal x(n) having the sampling frequency of 983.04 MHz and the feedback signal z(n). However, an envelope of a modulated signal input to the power amplifier 4 is equal to an envelope of a modulated signal converted into an analog signal after y(n) is interpolated by the interpolation DA converter 2. Therefore, in order to compensate the distortion occurring in the power amplifier 4, in particular, it is necessary to consider the sample points interpolated by the interpolation DA converter 2 to compensate the memory effect affected by the sample before and after a certain sample point. However, this interpolated sample point cannot be reflected in the distortion compensation signal for compensating the memory effect, because this sample point is a sub-sample point interpolated between sample points for the DPD 1 operating at the sampling rate before the interpolation.

The above problems will be described in detail. The memory tap in the equation (8) and the memory tap in the configuration of FIG. 11 for performing the upsampling by a factor of 2 for the DPD are the sample shift amount by the unit of the sampling cycle (=1/sampling frequency) after upsampling a signal by a factor of 2 to make it 1.96608 GHz at the upstream of the DPD 1. Therefore, for example, the memory tap $l_s$=1 in the above equation (8) is a memory tap of a sub-sample corresponding to the memory tap=0.5 for the DPD 1 operating at the sampling frequency of 983.04 MHz in the configuration shown in FIG. 14 in which the interpolation circuit is deleted, and the upsampling for the DPD is not performed. Therefore, the memory tap $l_s$=1 cannot be reflected in the distortion compensation signal that compensates the memory effect, because it is not a memory tap target for the DPD 1 operating at the sampling frequency of 983.04 MHz.

As described above, when the configuration in which the interpolation circuit at the upstream of the DPD is deleted, and the upsampling for the DPD is not performed is employed, and when the DPD is operated at a sampling frequency 1.2288 times the input signal band 800 MHz, it is difficult for the DPD and the distortion compensation apparatus according to the related art to achieve target compensation performance.

SUMMARY

In view of the above-described problems, an object of the present disclosure is to provide a distortion compensation apparatus and a distortion compensation method capable of achieving target compensation performance while reducing a coefficient amount even when a configuration in which an interpolation circuit at an upstream of the DPD is deleted, and upsampling for a DPD is not performed is employed.

In order to solve the above problems, a distortion compensation apparatus for compensating non-linear distortion of a power amplifier according to the present disclosure includes:

an AD converter configured to feed back an output signal of the power amplifier, convert it from analog to digital, and output the converted signal as a feedback signal;

a digital predistorter configured to perform distortion compensation processing on an input signal using the feedback signal and output a signal which has been subjected to the distortion compensation processing;

a DA converter disposed between the digital predistorter and the power amplifier and configured to convert the output signal of the digital predistorter from digital to analog and output the converted signal to the power amplifier, wherein the digital predistorter operates at a sampling rate at which the input signal not upsampled at an upstream of the digital predistorter is sampled, the digital predistorter includes:

a polynomial structure including a pseudo-interpolation and sub-sample shift processing unit configured to pseudo-interpolate a sample point between the sample points of the input signal and shift the pseudo-interpolated sample point by a sub-sample; and an FIR (Finite Impulse Response) filter disposed at a downstream of the polynomial structure and including a sub-sample delay filter configured to delay the sample point of the input signal by the sub-sample, and the digital predistorter uses the polynomial structure and the FIR filter to compensate distortion by the sample point of the input signal and also compensate distortion by a sub-sample point between the sample points of the input signal for the digital predistorter.

In order to address the above problems, a distortion compensation method performed by a distortion compensation apparatus for compensating non-linear distortion of a power amplifier. The distortion compensation method includes:

performing distortion compensation processing by a digital predistorter on an input signal using a feedback signal obtained by feeding back an output signal of the power amplifier and converting it from analog to digital and outputting the signal which has been subjected to the distortion compensation processing; and converting the output signal of the digital predistorter from digital to analog and outputting the converted signal to the power amplifier.

The digital predistorter operates at a sampling rate at which the input signal not upsampled at an upstream of the digital predistorter is sampled, the digital predistorter includes:

a polynomial structure including a pseudo-interpolation and sub-sample shift processing unit configured to pseudo-interpolate a sample point between the sample points of the input signal and shift the pseudo-interpolated sample point by a sub-sample; and an FIR (Finite Impulse Response) filter disposed at a downstream of the polynomial structure and including a sub-sample delay filter configured to delay the sample point of the input signal by the sub-sample, and the digital predistorter uses the polynomial structure and the FIR filter to compensate distortion by the sample point of the input signal and also compensate distortion by a sub-sample point between the sample points of the input signal for the digital predistorter.

BRIEF DESCRIPTION OF DRAWINGS

The above and other aspects, features and advantages of the present disclosure will become more apparent from the following description of certain exemplary embodiments when taken in conjunction with the accompanying drawings, in which:

FIG. 5-b is a view showing an example of a frequency characteristic of a filter attenuation amount for the number of taps when the 0.5 sample delay filter is composed of an FIR filter;

EMBODIMENTS

Hereinafter, embodiments of the present disclosure will be described with reference to the drawings.

Outline of Embodiment

Figure 1:
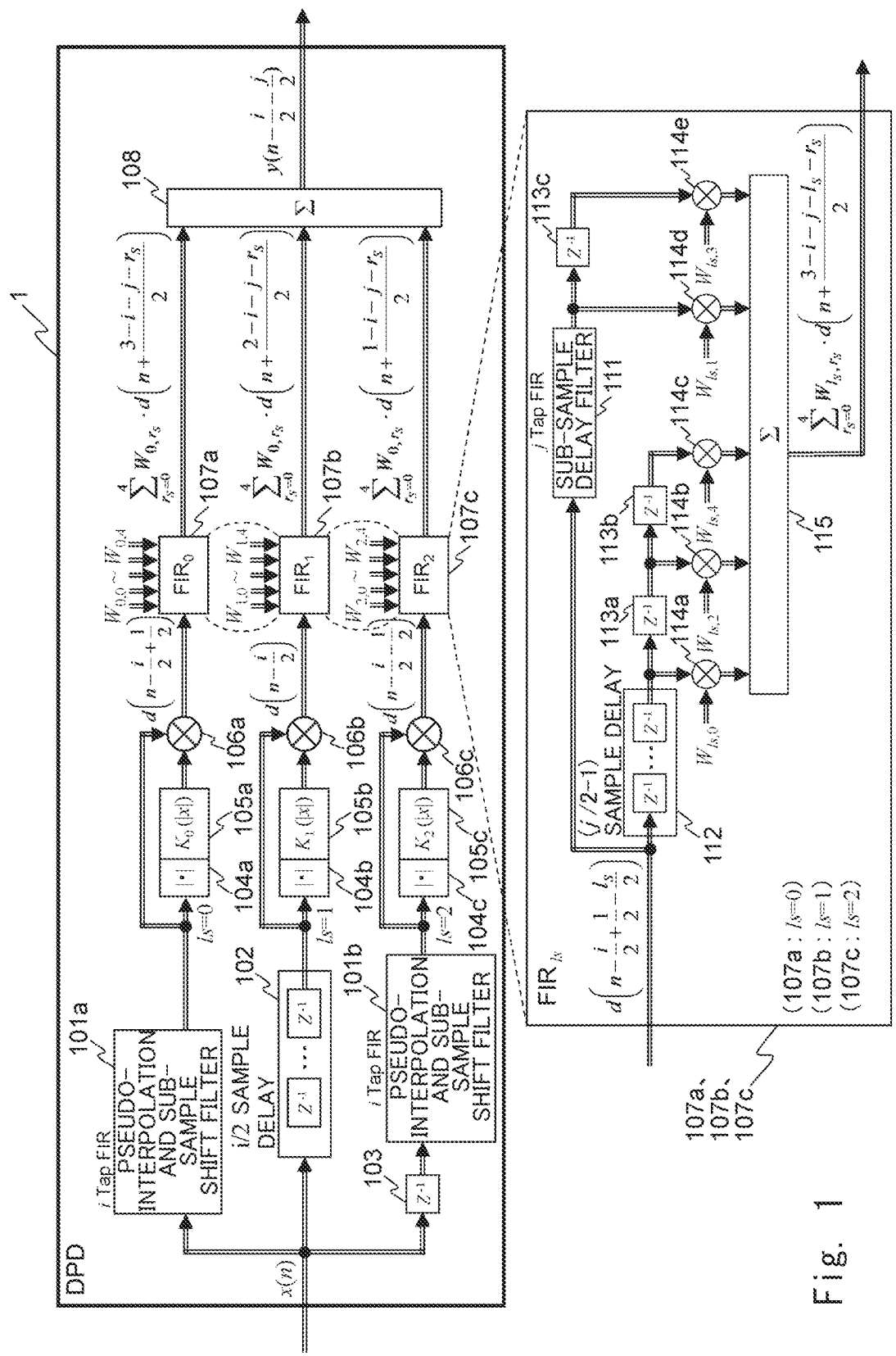
FIG. 1 is a block diagram showing a configuration example of a DPD according to an embodiment of the present disclosure.
Figure 8:
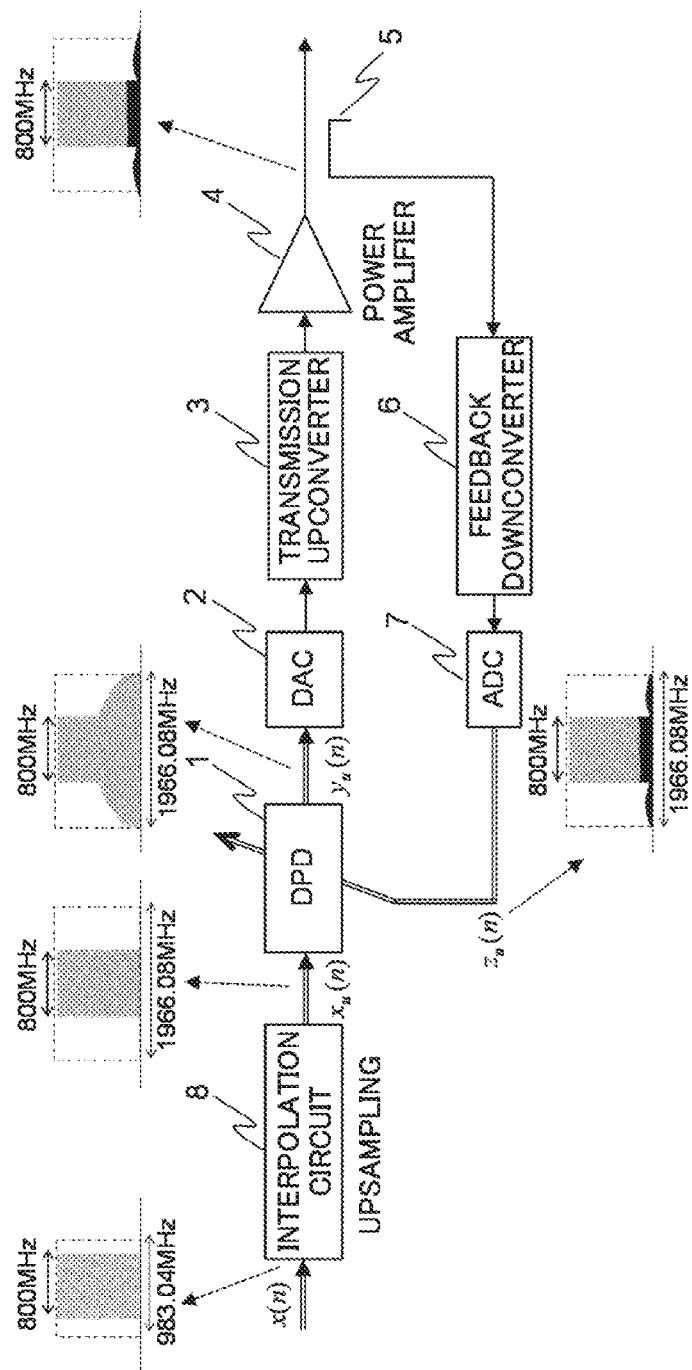
FIG. 8 is a block diagram showing a configuration example of a distortion compensation apparatus according to the related art.
Figure 9:
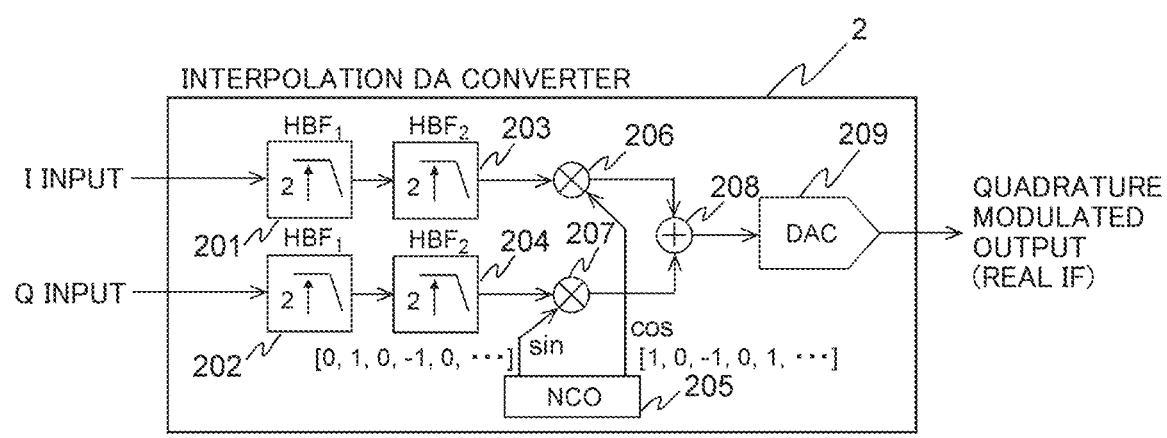
FIG. 9 is a block diagram showing an example of functions of the interpolation DA converter.
Figure 10:
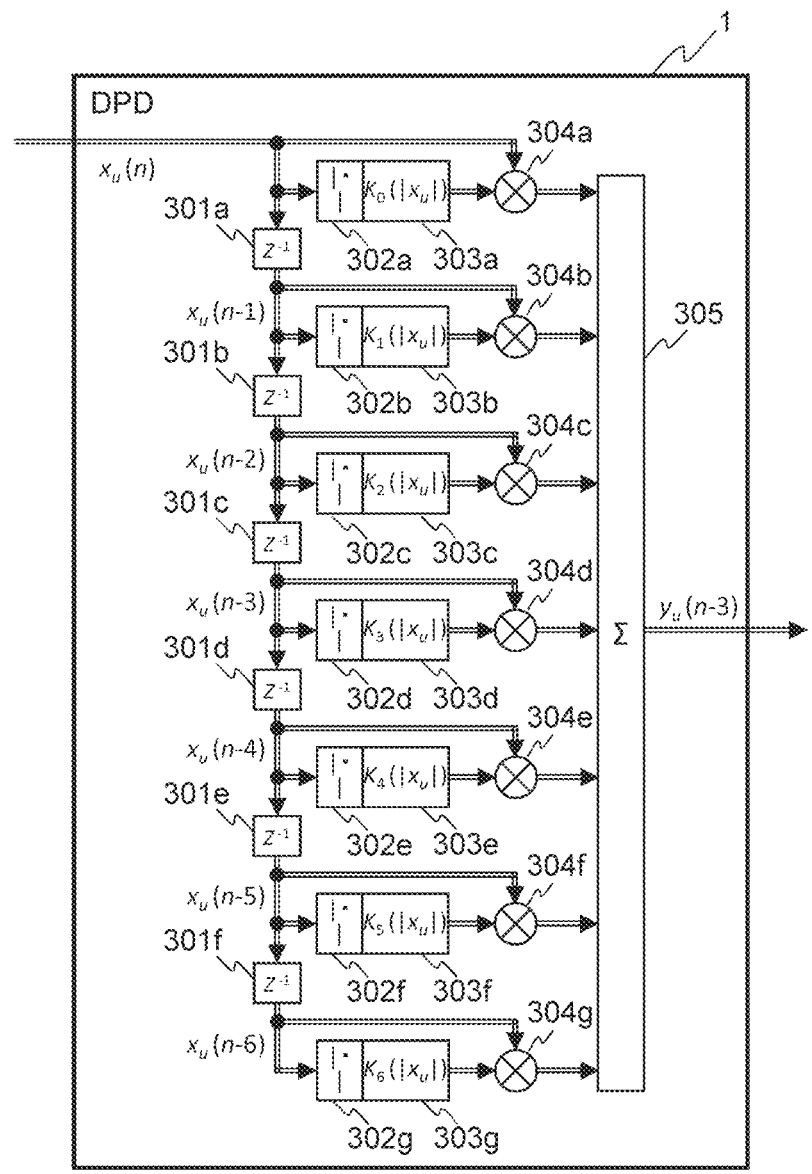
FIG. 10 is a block diagram showing a configuration example of a DPD in the distortion compensation apparatus according to the related art shown in FIG. 8.

FIG. 1 is a block diagram of a configuration example of a DPD 1 according to this embodiment. The DPD 1 according to this embodiment corresponds to the DPD 1 in the distortion compensation apparatus shown in FIG. 14. As described above, the distortion compensation apparatus shown in FIG. 14 has a configuration to address the second problem concerning the device performance in the distortion apparatus according to the related art, in which the interpolation circuit 8 shown in FIG. 8 is deleted, and upsampling for the DPD is not performed.

An outline of this embodiment will be described first prior to giving descriptions about the DPD 1 according to this embodiment shown in FIG. 1

Figure 14:
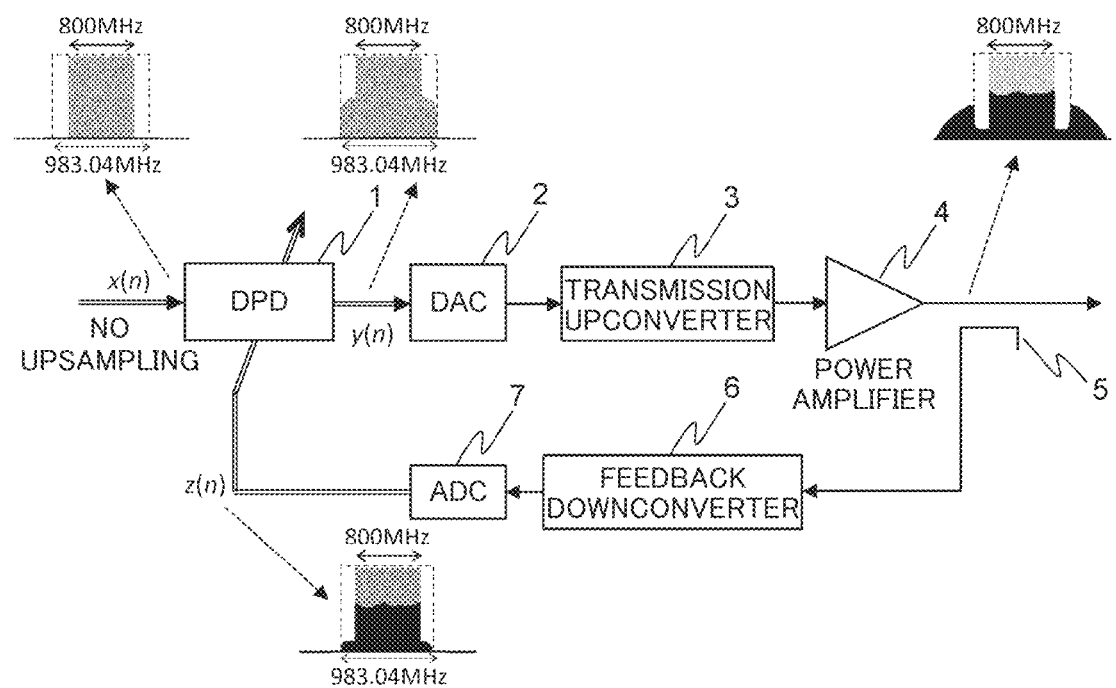
FIG. 14 is a block diagram showing a configuration example of a distortion compensation apparatus according to an embodiment of the present disclosure in which an interpolation circuit is deleted, and up sampling for the DPD is not performed.
Figure 15:
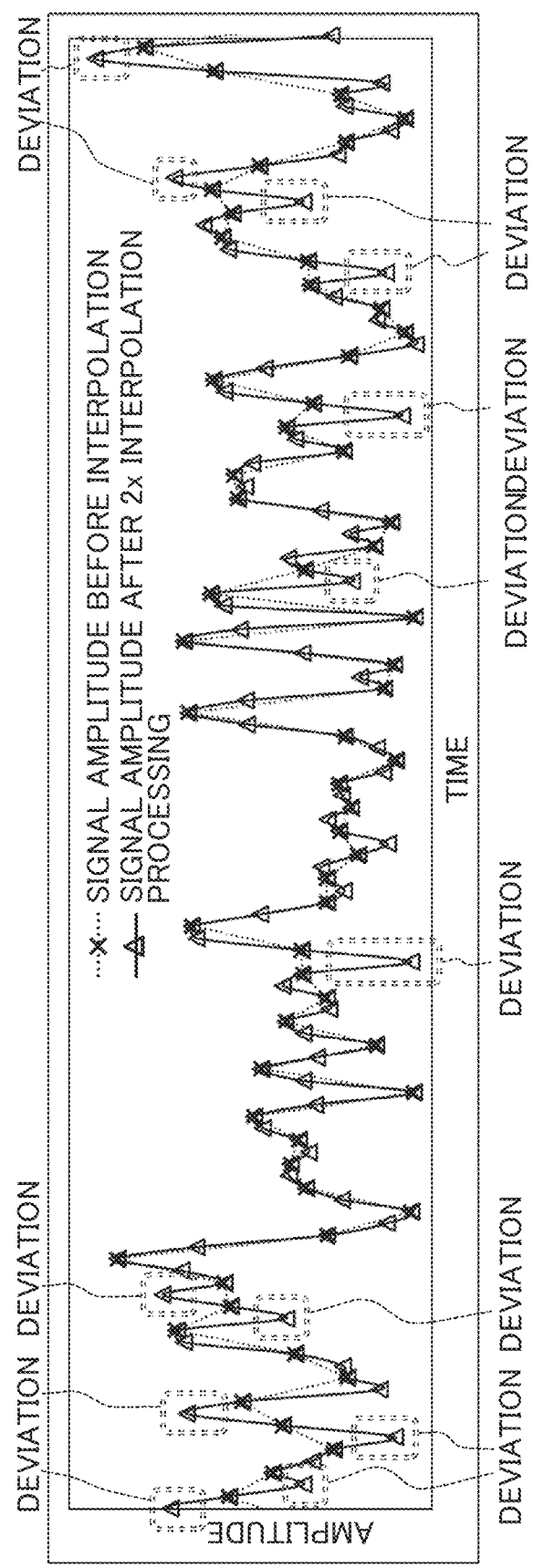
FIG. 15 shows an example of a comparison between an amplitude change of a signal in the 800 MHz band at the sampling frequency of 983.04 MHz before interpolation and an amplitude change of a signal obtained by upsampling this signal by a factor of 2 through the 2× interpolation processing to make it 1.96608 GHz.
Figure 16:
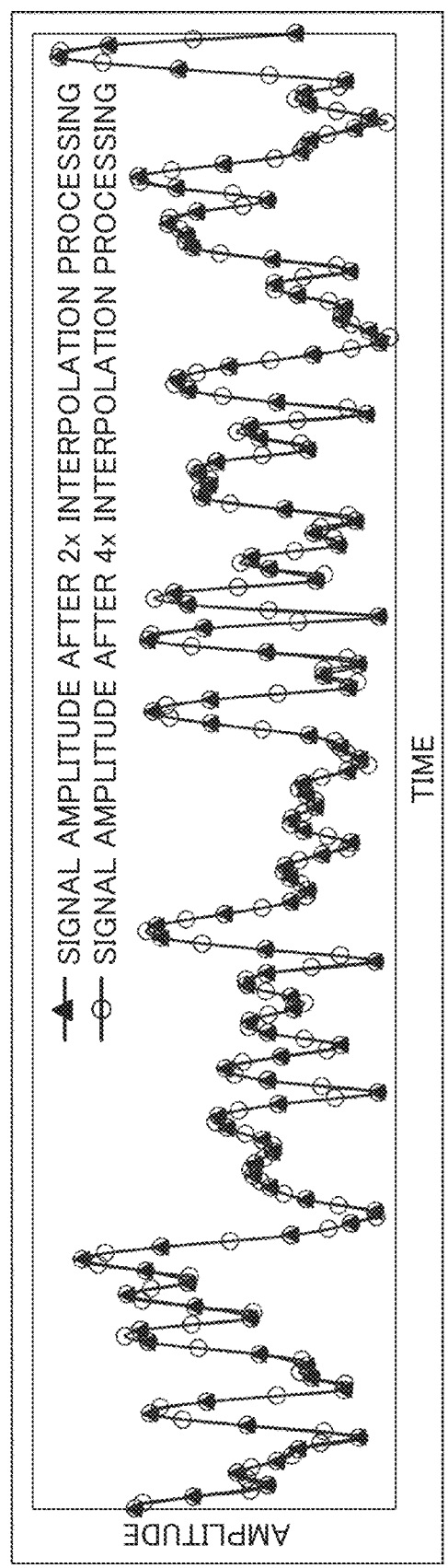
FIG. 16 shows an example of a comparison between an amplitude change of a signal upsampled by a factor of 2 to achieve a sampling frequency of 1.96608 GHz through 2× interpolation processing and an amplitude change of a signal obtained by upsampling this signal by a factor of 4 to achieve the sampling frequency of 3.93216 GHz through another 2× interpolation processing.

As described above, the distortion compensation apparatus shown in FIG. 14 operates at a low sampling rate not being up sampled without performing up sampling processing for the DPD at the upstream of the DPD 1. Even the distortion compensation apparatus shown in FIG. 14 can compensate the memory effect by sub-sample memory taps between sample points of the DPD 1 generated by the interpolation DA converter 2 at the downstream of the DPD 1, if it can achieve both of the following (A) and (B).

(A) Generating a signal corresponding to the signal $x_u(n-l_s)$ in the above equation (8) in which the coefficient amount is reduced and the signal upsampled by a factor of 2 in FIG. 1 from a sample signal sequence of the input signal of the DPD 1 which has not been up sampled.

Figure 11:
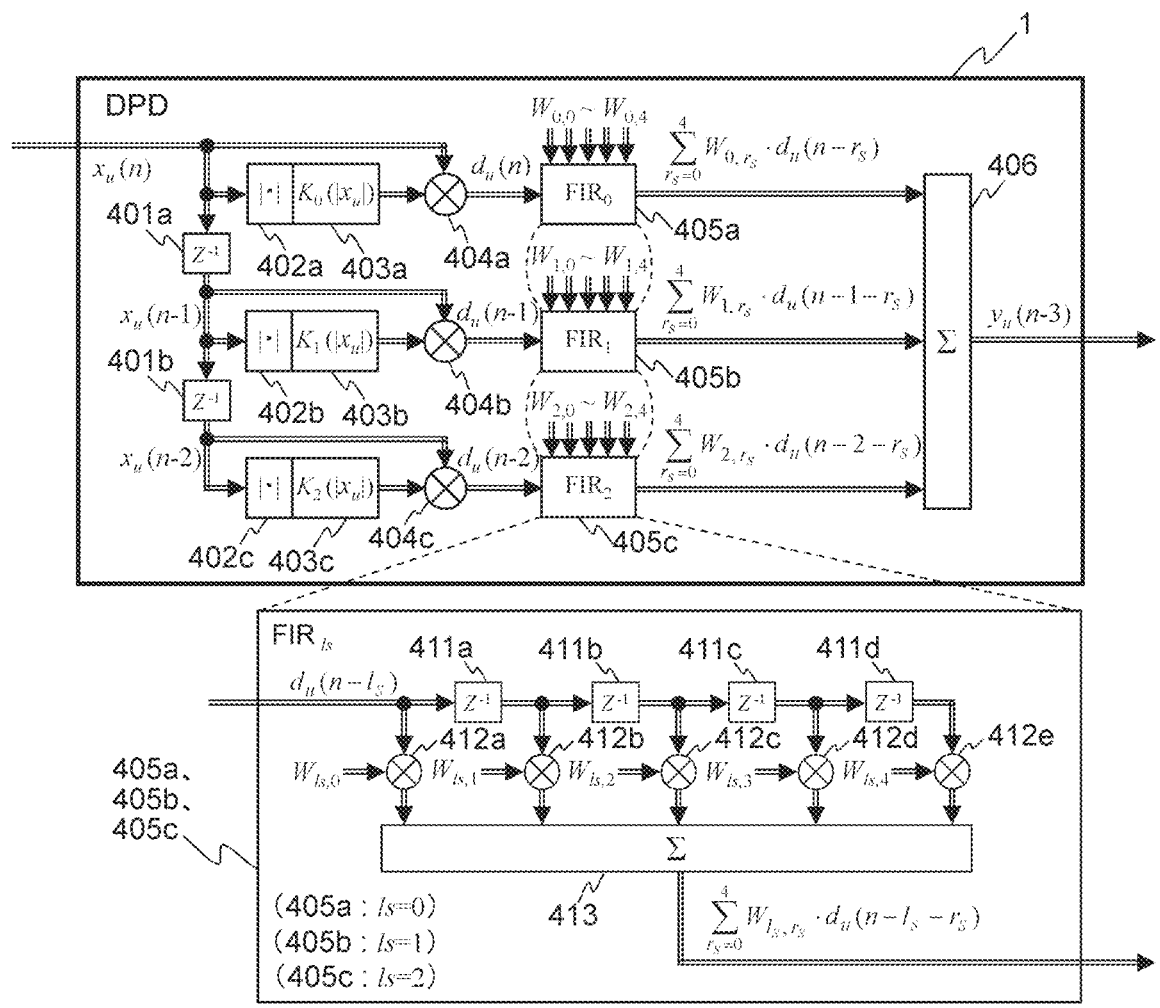
FIG. 11 is a block diagram showing a configuration example of a DPD to which a measurement for reducing a coefficient amount is applied to the DPD according to the related art shown in FIG. 10.

(B) Achieving the FIR filter equivalent to the FIR filter$_0$ 405a, the FIR filter$_1$ 405b, and the FIR filter$_2$ 405c operating at the doubled sampling frequency shown in FIG. 11 without performing up sampling by the factor of 2.

In the following equation (11), a signal corresponding to $x_u(n-l_s)$ upsampled by a factor of 2 in the above equation (8) generated from the sample signal sequence of the input signal of the DPD 1, which has not been upsampled, by pseudo-interpolation and sub-sample shift is substituted as a pseudo-interpolation signal $x_u'(n-l_s)$. Further, in the following equation (11), a signal corresponding to $y_u(n-3)$ obtained by the above equation (8) after the upsampling by a factor of 2 generated by $x_u'(n-l_s)$ and the sub-sample FIR filter including sub-sample delay taps is substituted as $y_u'(n-3)$. Furthermore, in the following equation (11), $x_u'(n-l_s-r_s)$ is substituted for $x_u(n-l_s-r_s)$ in the above equation (8), and $y_u'(n-3)$ is substituted for $y_u(n-3)$ in the above equation (8). Hereinafter, means for achieving the following equation (11) without upsampling by a factor of 2 will be described.

$$y_u'(n-3) = \sum_{l_s=0}^{2} \sum_{r_s=0}^{4} W_{l_s,r_s} \cdot x_u'(n-l_s-r_s) \cdot K_{l_s}(|x_u'(n-l_s-r_s)|) \quad (11)$$

In the equation (11), the memory taps $l_s$ are 0, +1, and +2, and the FIR taps $r_s$ are 0, +1, +2, +3, and +4. They are the sample shift amounts after the sampling by a factor of 2. Thus, for the DPD 1 operating at a sampling rate not being upsampled, the above memory taps correspond to the sub-sample shifts of 0, +0.5, and +1, and the above FIR taps correspond to the sub-sample shifts of 0, +0.5, +1, +1.5, and +2.

First, means for generating $x_u'(n-l_s)$ corresponding to the memory taps $l_s=0$, +1, and +2 at the FIR tap $r_s=0$ in the above equation (11) from the sample signal sequence of the input signal of the DPD 1, which is not upsampled, will be described.

Figure 2:
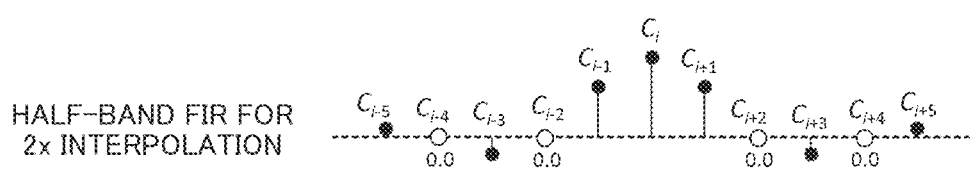
FIG. 2 is a view showing an example of tap coefficients of half-band FIR filters for 2× interpolation incorporated in an interpolation DA converter.

FIG. 2 shows an example of the tap coefficients of the 2× interpolation half-band FIR filter incorporated in the interpolation DA converter 2.

In the half-band FIR filter, a center tap is the i-th tap, the number of taps is (2i−1), and the tap coefficients are $C_1, C_2, \ldots, C_{i-1}, C_{i+1}, \ldots$, and $C_{2i-1}$. As described above, regarding this half-band FIR filter, about half of the tap coefficients are equal to zero, and the half-band FIR filter is commonly composed of about 59 taps. To make descriptions and drawings simple, the taps in FIG. 2 show only 11 taps including the center tap and center tap ±5 taps.

Figure 3:
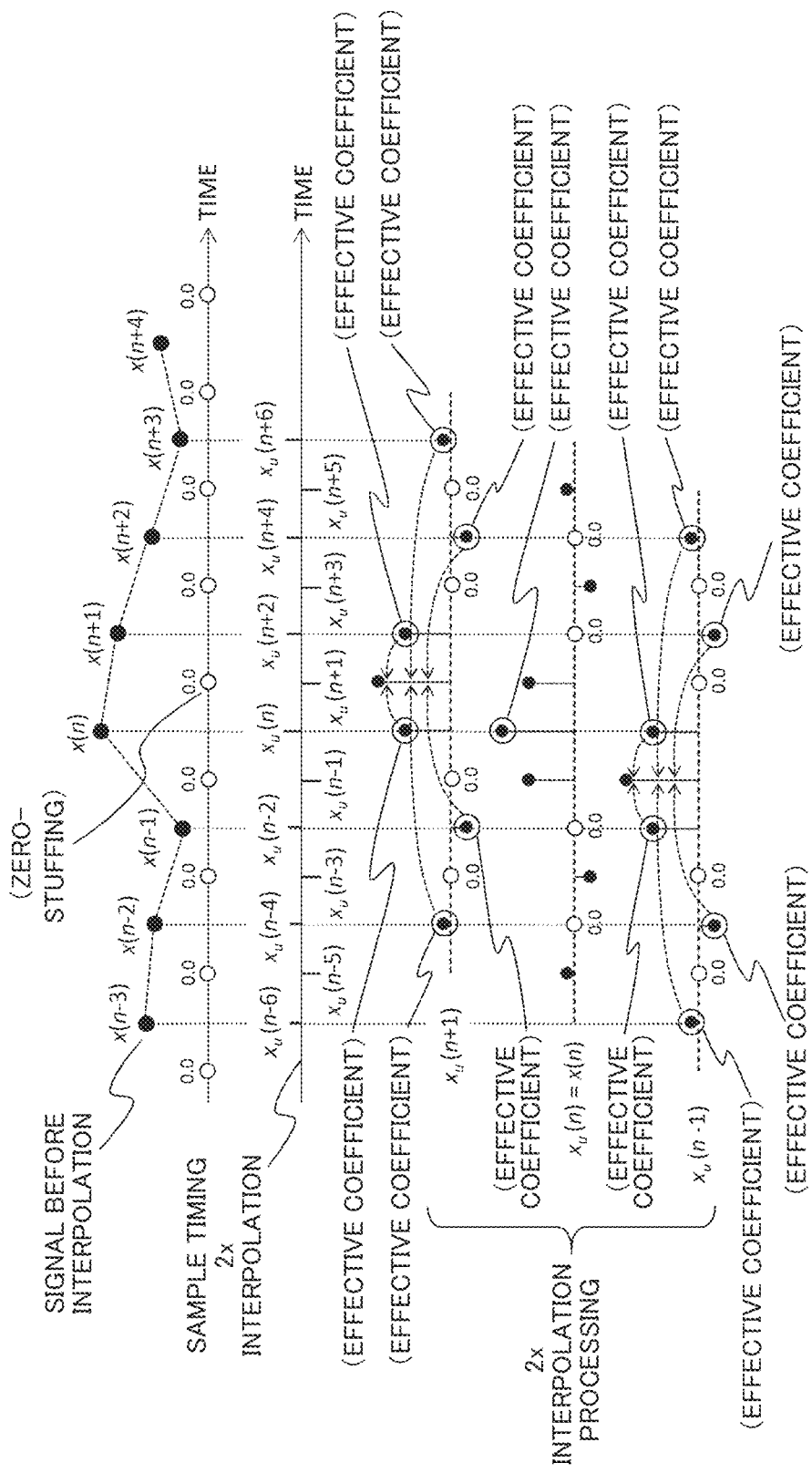
FIG. 3 is a timing chart illustrating an example of 2× interpolation processing in the interpolation DA converter.

FIG. 3 is a timing chart showing the 2× interpolation processing in the interpolation DA converter 2.

For example, when the signal before interpolation is the input signal x(n), the 2× interpolation processing is processing performed after performing zero-stuffing between sampling of the input signal x(n), in which an image is eliminated through the half-band FIR filter for 2× interpolation shown in FIG. 2, and the double-interpolated output signal $x_u(n)$ is obtained.

Here, as described above, the 2× interpolation processing is processing in which zero-stuffing is performed between sampling before the interpolation, and then passing through the half-band filter FIR. Therefore, in order to derive the double-interpolated sample $x_u(n)$ at a certain sample timing n where there are samples before the interpolation, only the center tap coefficient $C_i$ of the above half-band FIR filter for the 2× interpolation is an effective coefficient for the sample signal sequence before the interpolation. Thus, $x_u(n)$ can be expressed by the following equation (12) for the sample signal sequence before the interpolation.

$$x_u(n) = C_i \cdot x(n) \quad (12)$$

Next, unlike the above sample timing n, the sample timing n+1 after the 2× interpolation is a sample timing at which no sample before the interpolation is present. Thus, in order to derive $x_u(n+1)$ at the sample timing n+1, only i tap among (2i−1) taps other than the center tap and taps of zero coefficients of the above half-band FIR filter for 2× interpolation is the effective coefficient for the sample signal sequence before the interpolation. For this reason, for example, $x_u(n+1)$ can be expressed by the following equation (13) for the sample signal sequence before the interpolation when the tap coefficients of 11 taps, which are given to make descriptions simple in FIGS. 2 and 3.

$$x_u(n+1) = C_{i-5} \cdot x(n-2) + C_{i-3} \cdot x(n-1) + C_{i-1} \cdot x(n) + C_{i+1} \cdot x(n+1) + C_{i+3} \cdot x(n+2) + C_{i+5} \cdot x(n+3) \quad (13)$$

Furthermore, unlike the above sample timing n, the sample timing n−1 after the 2× interpolation is a sample timing where no sample before the interpolation is present. Thus, in order to derive $x_u(n-1)$ at the sample timing n−1, only i tap among (2i−1) taps other than the center tap and taps of zero coefficients of the half-band FIR filter for 2× interpolation is the effective coefficient for the sample signal sequence before the interpolation. For this reason, for example, $x_u(n+1)$ can be expressed by the following equation (14) for the sample signal sequence before the interpolation when the tap coefficients of 11 taps, which is simplified for simple descriptions, in FIGS. 2 and 3 are used.

$$x_u(n-1)=C_{i-5} \cdot x(n-3)+C_{i-3} \cdot x(n-2)+C_{i-1} \cdot x(n-1)+C_{i+1} \cdot x(n)+C_{i+3} \cdot x(n+1)+C_{i+5} \cdot x(n+2) \qquad (14)$$

Figure 4:
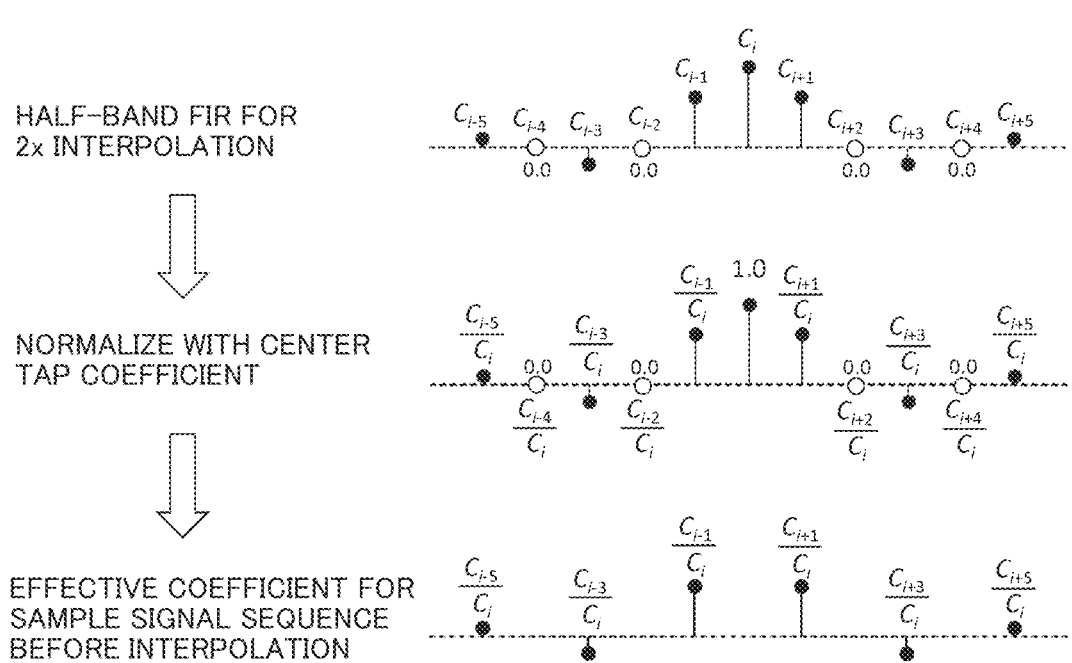
FIG. 4 is a view showing an example of a procedure for obtaining tap coefficients of a pseudo-interpolation filter to obtain a sub-sample memory taps=±0.5 for a DPD operating at a sampling rate not being up sampled.

Next, FIG. 4 shows a procedure for obtaining the tap coefficients of pseudo-interpolation filters (corresponding to pseudo-interpolation and sub-sample shift filters 101a and 101b in FIG. 1) in order to obtain the sub-sample memory tap=±0.5 for the DPD 1 operating at the sampling rate not upsampled shown in the equations (13) and (14).

The purpose of obtaining the tap coefficients of the pseudo-interpolation filter is not to actually perform the 2× interpolation processing shown in FIG. 2 on the example of the tap coefficients of the half-band FIR filter for 2× interpolation shown in FIG. 1. The purpose of obtaining the tap coefficients of the pseudo-interpolation filter is to obtain the effective coefficient which is to be multiplied by the sample signal sequence of the input signal of the DPD 1 before the interpolation at the sampling timing before the interpolation in order to obtain the sub-sample memory tap=±0.5 for the DPD 1 operating at the sampling rate not being upsampled.

At the sample timing at which the sample before the interpolation is present, all the coefficients are normalized with the center tap coefficient $C_i$ so that $x_u(n)=x(n)$ (i.e., $C_i=1.0$) in the above equation (12), and then the center tap and the taps of zero coefficients are removed. Consequently, the effective coefficient of the i-tap to be multiplied at the sampling timing before the interpolation is obtained. This obtained effective coefficient is the tap coefficient of the i-tap pseudo-interpolation filter for obtaining the sub-sample memory tap=±0.5 for the DPD 1 operating at the sampling rate not being up sampled. Thus, when all coefficients in the above equation (13) are normalized with the center tap coefficient $C_i$, the pseudo interpolation signal $x_u'(n+1)$ can be expressed by the following equation (15). Furthermore, when all coefficients in the above equation (14) are normalized with the center tap coefficient $C_i$, the pseudo interpolation signal $x_u'(n-1)$ can be expressed by the following equation (16).

$$x_u'(n+1) = \frac{C_{i-5}}{C_i} \cdot x(n-2) + \frac{C_{i-3}}{C_i} \cdot x(n-1) + \frac{C_{i-1}}{C_i} \cdot x(n) + \frac{C_{i+1}}{C_i} \cdot x(n+1) + \frac{C_{i+3}}{C_i} \cdot x(n+2) + \frac{C_{i+5}}{C_i} \cdot x(n+3) \qquad (15)$$

$$x_u'(n-1) = \frac{C_{i-5}}{C_i} \cdot x(n-3) + \frac{C_{i-3}}{C_i} \cdot x(n-2) + \frac{C_{i-1}}{C_i} \cdot x(n-1) + \frac{C_{i+1}}{C_i} \cdot x(n) + \frac{C_{i+3}}{C_i} \cdot x(n+1) + \frac{C_{i+5}}{C_i} \cdot x(n+2) \qquad (16)$$

Here, a processing delay of the i-tap pseudo-interpolation filter is (i−1) samples in the sampling after the 2× interpolation, i.e., a sampling conversion of (i/2−0.5) of the DPD 1 operating at the sampling rate not being upsampled. Therefore, when i/2 samples are delayed for the input in the sampling of the DPD 1 in the path where the sub-sample memory tap=0 in which the pseudo-interpolation filter is not disposed, the pseudo-interpolation filter in the path in which the pseudo-interpolation filter is disposed is 0.5 sample earlier than the path where the sub-sample memory tap=0, i.e., which is the pseudo-interpolation and sub-sample shift filter (corresponding to the pseudo-interpolation and sub-sample shift filter 101a in FIG. 1) for obtaining the sub-sample memory tap=−0.5 for the DPD 1. Further, when the pseudo-interpolation filter is disposed after one sample is delayed in the sampling of the DPD 1 for the input, the pseudo-interpolation filter disposed after the delay of one sample is delayed by 0.5 sample from the path where the sub-sample memory tap=0, i.e., which is the pseudo-interpolation and sub-sample shift filter (corresponding to the pseudo-interpolation and sub-sample shift filter 101b in FIG. 1) for obtaining the sub-sample memory tap=+0.5 for the DPD 1.

Note that that the pseudo-interpolation and sub-sample shift filter has a configuration in which the I phase tap coefficient and the Q phase tap coefficient are the same and does not require a complex multiplication.

As described so far, the sub-sample memory taps=±0.5 for the DPD 1 operating at the sampling rate not being upsampled can be obtained in each of the paths in which the pseudo-interpolation and sub-sample shift filters are disposed. Further, the sub-sample memory taps of −0.5, 0, and +0.5 can be achieved including the path where the sub-sample memory tap=0 in which the pseudo-interpolation and sub-sample shift filter is not disposed. The sub-sample memory taps of −0.5, 0, and +0.5 correspond to the memory taps 1=−1, 0, and +1 after the upsampling by a factor of 2 in the above equation (6). Therefore, like the substitution of the equations (7) and (8) for the equation (6), when substitution is made for the time shift amount 1 as in $1=l_s-1$, $x_u'(n-l_s)$ corresponding to the memory taps $l_s=0, +1, +2$ in the equation (11) is obtained.

Note that i indicating the number of taps of the pseudo-interpolation and sub-sample shift filter is an example of the assumed number of taps for the (2i−1) taps of the half-band FIR filter for the 2× interpolation in the interpolation DA converter 2. However, the present disclosure is not limited to this. As described above, when the common half-band FIR filter for 2× interpolation is 59 taps, i=30 according to the above example. However, in practice, the number of taps i of the pseudo-interpolation and sub-sample shift filter may be reduced within a range not affecting the performance for the purpose of reducing the circuit size of the pseudo-interpolation and sub-sample shift filter.

Secondly, means for obtaining sub-sample FIR taps=0, +0.5, +1, +1.5, and +2 in the sampling of the DPD 1 operating at the sampling rate not being upsampled in the equation (11) will be described.

Figure 5A:
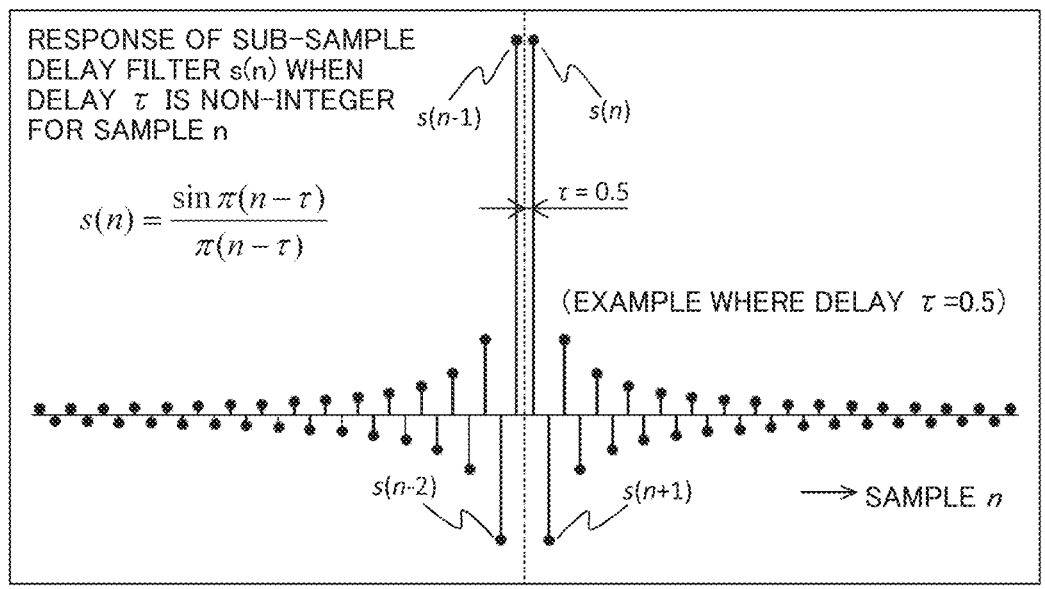
FIG. 5-a is a view showing an example of an impulse response of a 0.5 sample delay filter when a delay is a non-integer for a sample.
Figure 5B:
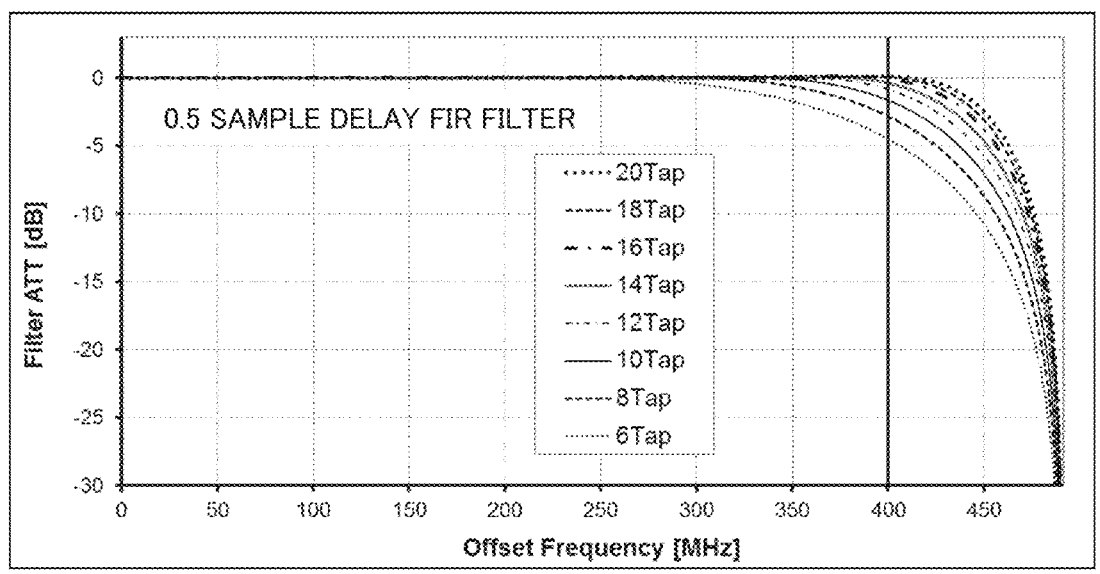

FIG. 5-a shows an impulse response example of a 0.5 sample delay filter when a delay is a non-integer for the sample, for example, the delay is 0.5 sample.

When the delay τ is a non-integer for the sample, the impulse response s (n) is infinite (IIR: Infinite Impulse Response) and not finite (FIR) as shown in the following equation (17).

$$s(n) = \frac{\sin\pi(n-\tau)}{\pi(n-\tau)} \qquad (17)$$

Thus, in terms of a practical implementation, the number of taps is limited to the finite number of taps j to thereby reduce the circuit size of the filter. When the taps of the sub-sample delay IIR filter is limited, in-band ripple occurs. In order to suppress the in-band ripple, processing for a multiplication by a window function with a delayed point as the center is necessary. However, the number of taps and the characteristic is in a trade-off relationship, because the pass band is narrowed through this processing.

FIG. 5-*b* shows a frequency characteristic of a filter attenuation amount for the number of taps j when the tap coefficient is limited, multiplied by the window function, and the 0.5 sample delay filter is composed of a FIR filter.

The sub-sample delay filter (corresponding to a sub-sample delay filter 111 in FIG. 1) is a filter intended for distortion compensation within the 800 MHz carrier band. Thus, when the attenuation amount at the 400 MHz offset point on one side is suppressed to 0.5 dB or less, an example of the number of taps j required for the sub-sample delay filter is 14 taps or more.

However, unlike the above pseudo-interpolation and sub-sample shift filter, this sub-sample delay filter simply gives a sub-sample delay. Thus, when one j-tap 0.5 sample delay filter is included in one path, a 1.5 sample delay can be achieved by disposing a one-sample delay device at a downstream of the 0.5 sample delay filter.

Here, a processing delay of the j tap sub-sample delay filter is (j−1) samples in the sampling after the 2× interpolation, i.e., a sampling conversion of (j/2−0.5) of the DPD 1 operating at the sampling rate not being upsampled. Therefore, when (j/2−1) samples are delayed in the sampling of the DPD 1 for the input of the FIR filter in the path in which the sub-sample delay filter is not disposed, the signal that passed through the above sub-sample delay filter becomes a signal delayed by 0.5 sample from the signal after (j/2−1) samples are delayed. For this reason, the sub-sample delay filter is a sub-sample delay filter for obtaining the sub-sample FIR tap=+0.5 for the DPD 1.

Note that the sub-sample delay filter has a configuration in which the I phase tap coefficient and the Q phase tap coefficient are the same and does not require a complex multiplication.

In the path in which the sub-sample delay filter is disposed, the sub-sample delay filter delays a signal delayed by 0.5 sample from the above signal delayed by (j/2−1) samples and further delays a signal from the signal delayed by 0.5 sample by one sample, which is a signal delayed by 1.5 samples from the above signal delayed by (j/2−1) in the sampling of the DPD 1, and then the delayed signals are output. On the other hand, in the path in which the sub-sample delay filter is not disposed, the signal delayed by (j/2−1) samples in the sampling of the DPD 1, and the signals delayed by one sample and two samples from this signal in the sampling of the DPD 1 are output. As a result, signals having a delay amount of 0 sample, 0.5 sample, 1 sample, 1.5 samples, and 2 samples from the above signal delayed by (j/2−1) samples can be obtained in the sampling of the DPD 1, thereby achieving the sub-sample FIR taps=0, +0.5, +1, +1.5, and +2 with five taps. With these five taps, the FIR filters corresponding to the FIR taps $r_s$=0, +1, +2, +3, and +4 operating at twice the sampling frequency can be achieved without upsampling by a factor of 2.

As described above, a signal corresponding to the above equation (11) can be achieved by the polynomial structure including the pseudo-interpolation sub-sample shift filter with the reduced coefficient amount and the sub-sample FIR filter including the sub-sample delay filter.

In practice, with the addition of the above pseudo-interpolation and sub-sample shift filter and the above sub-sample delay filter, a total delay amount (i−1)+(j−2) samples becomes a processing delay added in $l_s$=0 and $r_s$=0 at a certain sample timing n of the input signal of the DPD 1, where the total delay amount is obtained by adding the delay amount (i−1) samples in the sampling after the 2× interpolation by the above pseudo-interpolation and sub-sample shift filter and the delay amount (j−2) samples obtained by converting the (j/2) sample delay in the sampling of the DPD 1 added to the path in which the above sub-sample delay filter is not disposed. Thus, the above equation (11) becomes the following equation (18).

$$y'_u(n-3-(i-1)-(j-2)) = \sum_{l_s=0}^{2}\sum_{r_s=0}^{4} W_{l_s,r_s} \cdot x'_u(n-l_s-r_s-(i-1)-(j-2)) \cdot K_{l_s}(|x'_u(n-l_s-r_s-(i-1)-(j-2))|) \quad (18)$$

Further, the equation (18) is organized, and the following equation (19) is obtained.

$$y'_u(n-i-j) = \sum_{l_s=0}^{2}\sum_{r_s=0}^{4} W_{l_s,r_s} \cdot x'_u(n+3-i-j-l_s-r_s) \cdot K_{l_s}(|x'_u(n+3-i-j-l_s-r_s)|) \quad (19)$$

That is, at the sampling rate of the DPD 1 operating at the sampling rate not upsampled by a factor of 2, the calculation corresponding to the equation (19) in which the rate upsampled by a factor of 2 is substituted for the rate not upsampled by a factor of 2 can be achieved by calculating the following equation (20).

$$y\left(n-\frac{i}{2}-\frac{j}{2}\right) = \sum_{l_s=0}^{2}\sum_{r_s=0}^{4} W_{l_s,r_s} \cdot x\left(n+\frac{3-i-j-l_s-r_s}{2}\right) \cdot K_{l_s}\left(\left|x\left(n+\frac{3-i-j-l_s-r_s}{2}\right)\right|\right) \quad (20)$$

Further, like in the above equation (8), in the equation (20), a polynomial with $l_s$=1 and $r_s$=2 where the time shift amount of the output signal of the DPD 1 for the input signal of the DPD 1 becomes zero corresponds to the memoryless polynomial.

As described above, it has been confirmed that the above equation (20) can be achieved from the sample signal sequence of the input signal of the DPD 1 not upsampled without upsampling by a factor of 2, by the polynomial structure including the above pseudo-interpolation and sub-sample shift filter and the above FIR filter including the above sub-sample delay filter.

Configuration of Embodiment

The DPD 1 according to this embodiment has a configuration including the polynomial structure including the above pseudo-interpolation and sub-sample shift filter and the FIR filter disposed at the downstream of the polynomial structure and including the above sub-sample delay filter. With this configuration, the above equation (20) is achieved without upsampling by a factor of 2 from the sample signal sequence of the input signal of the DPD 1 not being upsampled, which has been confirmed as feasible above.

FIG. 1 shows one configuration example of the DPD 1 according to this embodiment when the calculation of the above equation (20) is configured to be performed by, for example, a hardware function. Hereinafter, the DPD 1 according to this embodiment shown in FIG. 1 will be described in detail.

As described above, the DPD 1 according to this embodiment shown in FIG. 1 corresponds to the DPD 1 in the distortion compensation apparatus shown in FIG. 14. FIG. 14 shows a configuration example of the distortion compensation apparatus proposed in this embodiment. As described above, the distortion compensation apparatus shown in FIG. 14 has a configuration to address the second problem concerning the device performance in the distortion apparatus according to the related art, in which the interpolation circuit 8 shown in FIG. 8 is deleted, and upsampling for the DPD is not performed.

The DPD 1 according to this embodiment shown in FIG. 1 includes pseudo-interpolation and sub-sample shift filters 101*a* and 101*b* composed of i-tap FIR filters, an i/2 sample delay device 102, a one-sample delay device 103, amplitude address calculation circuits 104*a*, 104*b*, and 104*c*, LUTs 105*a*, 105*b*, and 105*c*, complex multipliers 106*a*, 106*b*, and 106*c*, FIR filter$_0$ 107*a*, FIR filter$_1$ 107*b*, FIR filter$_2$ 107*c*, and an adder 108. Each of the FIR filter$_0$ 107*a*, the FIR filter$_1$ 107*b*, and the FIR filter$_2$ 107*c* includes a sub-sample delay filter 111 composed of a j-tap FIR filter, a (j/2−1) sample delay device 112, one-sample delay devices 113*a*, 113*b*, and 113*c*, complex multipliers 114*a*, 114*b*, 114*c*, 114*d*, 114*e*, and an adder 115.

The DPD 1 according to this embodiment shown in FIG. 1 is branched in parallel from the input stage of the DPD 1 into three paths (first paths), and each of the three paths is provided with a pseudo-interpolation and sub-sample shift filter 101*a*, an i/2 sample delay device 102, and a pseudo-interpolation and sub-sample shift filter 101*b*.

The pseudo-interpolation and sub-sample shift filters 101*a* and 101*b* are an example of a pseudo-interpolation and sub-sample shift processing unit that interpolates sub-sample points in a pseudo manner between sample points of the signal input thereto and shifts the sub-sample points interpolated in a pseudo manner by the sub-samples. The i/2 sample delay device 102 is an example of a first delay unit that delays the sample points of a signal input thereto by i/2 samples.

The amplitude address calculation circuit 104*a*, the LUT 105*a*, the complex multiplier 106*a*, and the FIR filter$_0$ 107*a* are disposed at a downstream of the pseudo-interpolation and sub-sample shift filter 101*a*. The amplitude address calculation circuit 104*b*, the LUT 105*b*, the complex multiplier 106*b*, and the FIR filter$_1$ 107*b* are disposed at a downstream of the i/2 sample delay device 102. The one-sample delay device 103 is disposed at an upstream of the pseudo-interpolation and sub-sample shift filter 101*b*. The amplitude address calculation circuit 104*c*, the LUT 105*c*, the complex multiplier 106*c*, and the FIR filter$_2$ 107*c* are disposed at a downstream of the pseudo-interpolation and sub-sample shift filter 101*b*. The one-sample delay device 103 delays the sample points of the signal input thereto by one sample. Further, the adder 108 is disposed at a downstream of the FIR filter$_0$ 107*a*, the FIR filter$_1$ 107*b*, and the FIR filter$_2$ 107*c*. The adder 108 is an example of a first adder. Note that the polynomial structure is defined as a structure, for example, from the beginning to the complex multiplier 106*a* in the path in which the pseudo-interpolation and sub-sample shift filter 101*a* is disposed. The same applies to other paths.

Each of the FIR filter$_0$ 107*a*, the FIR filter$_1$ 107*b*, and the FIR filter$_2$ 107*c* is branched in parallel from the input stage of its own FIR filter into two paths (second paths). Each of the two paths includes a sub-sample delay filter 111, and a (j/2−1) sample delay device 112.

The sub-sample delay filter 111 delays the sample points of the signal input thereto by sub-samples. The (j/2−1) sample delay device 112 is an example of a second delay unit which delays the sample point of the signal input thereto by (j/2−1) samples.

The one-sample delay devices 113*a* and 113*b* connected in series are disposed at a downstream of the (j/2−1) sample delay device 112. Further, the complex multiplier 114*a* is disposed in parallel with the one-sample delay device 113*a* at a downstream of the (j/2−1) sample delay device 112. The one-sample delay device 113*b* is disposed in parallel with the complex multiplier 114*b* at a downstream of the one-sample delay device 113*a*. The complex multiplier 114*c* is disposed at a downstream of the one-sample delay 113*b*. The one-sample delay device 113*c* is disposed at a downstream of the sub-sample delay filter 111. The complex multiplier 114*d* is disposed in parallel with the one-sample delay device 113*c* at the downstream of the sub-sample delay filter 111. The complex multiplier 114*e* is disposed at the downstream of the one-sample delay device 113*c*. The one-sample delay devices 113*a*, 113*b*, and 113*c* delay the sample points of the signal input thereto by one sample. The adder 115 is disposed at a downstream of the complex multipliers 114*a*, 114*b*, 114*c*, 114*d*, and 114*e*. The adder 115 is an example of the second adder.

The sample amount of each delay described above is a value at the sampling rate of the DPD 1 operating at the sampling rate not being up sampled.

In FIG. 1, to make descriptions simple, the polynomial in the outputs of the complex multipliers 106*a*, 106*b*, and 106*c* for each term of the memory tap $l_s$ of the above equation (20), which are:

$$x\left(n - \frac{i}{2} + \frac{1}{2} - \frac{l_s}{2}\right) \cdot K_{l_s}\left(\left|x\left(n - \frac{i}{2} + \frac{1}{2} - \frac{l_s}{2}\right)\right|\right)$$

is expressed by:

$$d\left(n - \frac{i}{2} + \frac{1}{2} - \frac{l_s}{2}\right)$$

as shown in the equation (21).

$$x\left(n - \frac{i}{2} + \frac{1}{2} - \frac{l_s}{2}\right) \cdot K_{l_s}\left(\left|x\left(n - \frac{i}{2} + \frac{1}{2} - \frac{l_s}{2}\right)\right|\right) = d\left(n - \frac{i}{2} + \frac{1}{2} - \frac{l_s}{2}\right) \quad (21)$$

Operation of Embodiment

Hereinafter, the operation of the DPD 1 according to this embodiment shown in FIG. 1 will be described.

The pseudo-interpolation and sub-sample shift filter 101*a* generates:

$$x\left(n - \frac{i}{2} + \frac{1}{2}\right)$$

at the sampling rate of the DPD 1 corresponding to a 2× interpolation signal $x_u'$ (n−i+1), which has been delayed from the input signal x(n) of the DPD 1 at a certain sample timing by (i−1) samples in the sampling after the 2× interpolation by the pseudo-interpolation and sub-sample shift filter 101a.

Further, the i/2 sample delay device 102 generates:

$$x\left(n - \frac{i}{2}\right)$$

at the sampling rate of the DPD 1 corresponding to the signal $x_u'(n-i)$ delayed by i samples ($=i/2 \times 2$ samples) in the sampling after the 2× interpolation.

Furthermore, the one-sample delay device 103 and the pseudo-interpolation and sub-sample shift filter 101b generates:

$$x\left(n - \frac{i}{2} - \frac{1}{2}\right)$$

at the sampling rate of the DPD 1 corresponding to the 2× interpolation signal $x_u'(n-i-1)$ delayed by (i+1) samples in the sampling after the 2× interpolation.

In the manner described above, signals of:

$$x\left(n - \frac{i}{2} + \frac{1}{2}\right),\ x\left(n - \frac{i}{2}\right),\ x\left(n - \frac{i}{2} - \frac{1}{2}\right)$$

which are delayed each by one sample in the sampling after the 2× interpolation are generated.

The amplitude address calculation circuits 104a, 104b, and 104c calculate the amplitude addresses for the LUTs corresponding to the amplitudes:

$$\left|x\left(n - \frac{i}{2} + \frac{1}{2}\right)\right|,\ \left|x\left(n - \frac{i}{2}\right)\right|,\ \left|x\left(n - \frac{i}{2} - \frac{1}{2}\right)\right|$$

of the signals, respectively.

The LUTs 105a, 105b, and 105c are referred to based on the LUT amplitude addresses for the respective signals each delayed by one sample in the sampling after the 2× interpolation, and output signals of the respective LUTs corresponding to the LUT amplitude addresses are obtained. Then, the complex multipliers 106a, 106b, and 106c complex-multiply the output signals of the respective LUTs by the respective signals each delayed by one sample in the sampling after the 2× interpolation. The results of the complex multiplication by the complex multipliers 106a, 106b, and 106c are input to the FIR filter$_0$ 107a, the FIR filter$_1$ 107b, and the FIR filter$_2$ 107c, respectively, as the polynomial:

$$d\left(n - \frac{i}{2} + \frac{1}{2} - \frac{l_s}{2}\right)$$

for each term of the memory taps $l_s$=0, 1, 2 in the sampling after the 2× interpolation. The FIR filter$_0$ 107a corresponds to the memory tap $l_s$=0 in the sampling after 2× interpolation. The FIR filter$_1$ 107b corresponds to the memory tap $l_s$=1 in the sampling after 2× interpolation. The FIR filter$_2$ 107c corresponds to the memory tap $l_s$=2 in the sampling after 2× interpolation.

In each of the FIR filter$_0$ 107a, the FIR filter$_1$ 107b, and the FIR filter$_2$ 107c, the signal shown below is output to correspond to the FIR taps $r_s$=0, 1, 2, 3, and 4 in the sampling after the 2× interpolation for each input:

$$d\left(n - \frac{i}{2} + \frac{1}{2} - \frac{l_s}{2}\right)$$

In the FIR tap $r_s$=0, the (j/2−1) sample delay device 112 generates and outputs:

$$d\left(n - \frac{i}{2} + \frac{1}{2} - \frac{l_s}{2} - \frac{j}{2} + 1\right)$$

corresponding to a signal delayed by (j−2) samples in the sampling after the 2× interpolation.

In the FIR tap $r_s$=1, the sub-sample delay filter 111 composed of the j-tap FIR filter generates and outputs:

$$d\left(n - \frac{i}{2} + \frac{1}{2} - \frac{l_s}{2} - \frac{j}{2} + \frac{1}{2}\right)$$

corresponding to a signal delayed by (j−1) samples in the sampling after the 2× interpolation.

In FIR tap $r_s$=2, the one-sample delay device 113a at the downstream of the (j/2−1) sample delay device 112 generates and outputs:

$$d\left(n - \frac{i}{2} + \frac{1}{2} - \frac{l_s}{2} - \frac{j}{2}\right)$$

corresponding to a signal delayed by j samples in the sampling after the 2× interpolation.

In the FIR tap $r_s$=3, the one-sample delay device 113c at the downstream of the sub-sample delay filter 111 generates and outputs:

$$d\left(n - \frac{i}{2} + \frac{1}{2} - \frac{l_s}{2} - \frac{j}{2} - \frac{1}{2}\right)$$

corresponding to a signal delayed by (j+1) samples in the sampling after the 2× interpolation.

In the FIR tap $r_s$=4, the one-sample delay device 113b at the downstream of the one-sample delay device 113a generates and outputs:

$$d\left(n - \frac{i}{2} + \frac{1}{2} - \frac{l_s}{2} - \frac{j}{2} - 1\right)$$

corresponding to a signal delayed by (j+2) samples in the sampling after the 2× interpolation.

When the output of each of the five taps in the FIR$_{l_s}$ corresponding to each memory tap $l_s$ is generalized and expressed using the memory taps $l_s$ (=0, 1, 2) and the FIR taps $r_s$ (=0, 1, 2, 3, 4) as variables, it will be:

$$d\left(n + \frac{3-i-j-l_s-r_s}{2}\right)$$

That is, the output signal of each FIR tap $r_s$ corresponding to delaying by one sample in the sampling after the 2× interpolation is expressed as follows.

$$d\left(n + \frac{3-i-j-l_s-r_s}{2}\right)$$

Each of the complex multipliers 114a, 114d, 114b, 114e, and 114c complex-multiplies the output signal of each FIR tap $r_s$ by the filter (complex) coefficients $W_{l_s,0}$, $W_{l_s,1}$, $W_{l_s,2}$, $W_{l_s,3}$, and $W_{l_s,4}$ corresponding to the FIR taps $r_s$=0, 1, 2, 3, and 4, respectively. After that, the signals complex-multiplied by the complex multipliers 114a, 114d, 114b, 114e, and 114c are added by the adder 115. The signal added by the adder 115 is output from the FIR filter$_0$ 107a, the FIR filter$_1$ 107b, and the FIR filter$_2$ 107c as:

$$\sum_{r_s=0}^{4} W_{l_s,r_s} \cdot d\left(n + \frac{3-i-j-l_s-r_s}{2}\right)$$

for each memory tap $l_s$.

At this time, the output signal of the FIR filter$_0$ 107a corresponding to the memory tap $l_s$=0 is as follows.

$$\sum_{r_s=0}^{4} W_{0,r_s} \cdot d\left(n + \frac{3-i-j-r_s}{2}\right)$$

The output signal of the FIR filter$_1$ 107b corresponding to the memory tap $l_s$=1 is as follows.

$$\sum_{r_s=0}^{4} W_{1,r_s} \cdot d\left(n + \frac{2-i-j-r_s}{2}\right)$$

The output signal of the FIR filter$_2$ 107c corresponding to the memory tap $l_s$=2 is as follows.

$$\sum_{r_s=0}^{4} W_{2,r_s} \cdot d\left(n + \frac{1-i-j-r_s}{2}\right)$$

The output signals of the FIR filter$_0$ 107a, the FIR filter$_1$ 107b, and the FIR filter$_2$ 107c are eventually added by the adder 108, and are output from the DPD 1 as the polynomial expressed by the above equation (20) in which the coefficient amount is reduced.

As described above, the tap coefficients of the pseudo-interpolation and sub-sample shift filters 101a and 101b and the tap coefficients of the sub-sample delay filter 111 are already known fixed coefficients and need not be changed.

Further, the i/2 sample delay device 102 is a fixed delay device determined by the number of taps i of the pseudo-interpolation and sub-sample shift filters 101a and 101b.

Likewise, the (j/2-1) sample delay device 112 is a fixed delay device determined by the number of taps j of the sub-sample delay filter 111.

Therefore, in the DPD 1 according to this embodiment shown in FIG. 1, the power series coefficient amounts in the LUTs 105a, 105b, and 105c and the tap coefficient amounts of the FIR filter$_0$ 107a, the FIR filter$_1$ 107b, and the FIR filter$_2$ 107c, which need to be derived by adaptive control and be updated, are the same as the coefficient amounts of the above equation (8) in which the coefficient amount is reduced by 30% from that of the related art and the configuration of FIG. 11.

Effect of Embodiment

Figure 6:
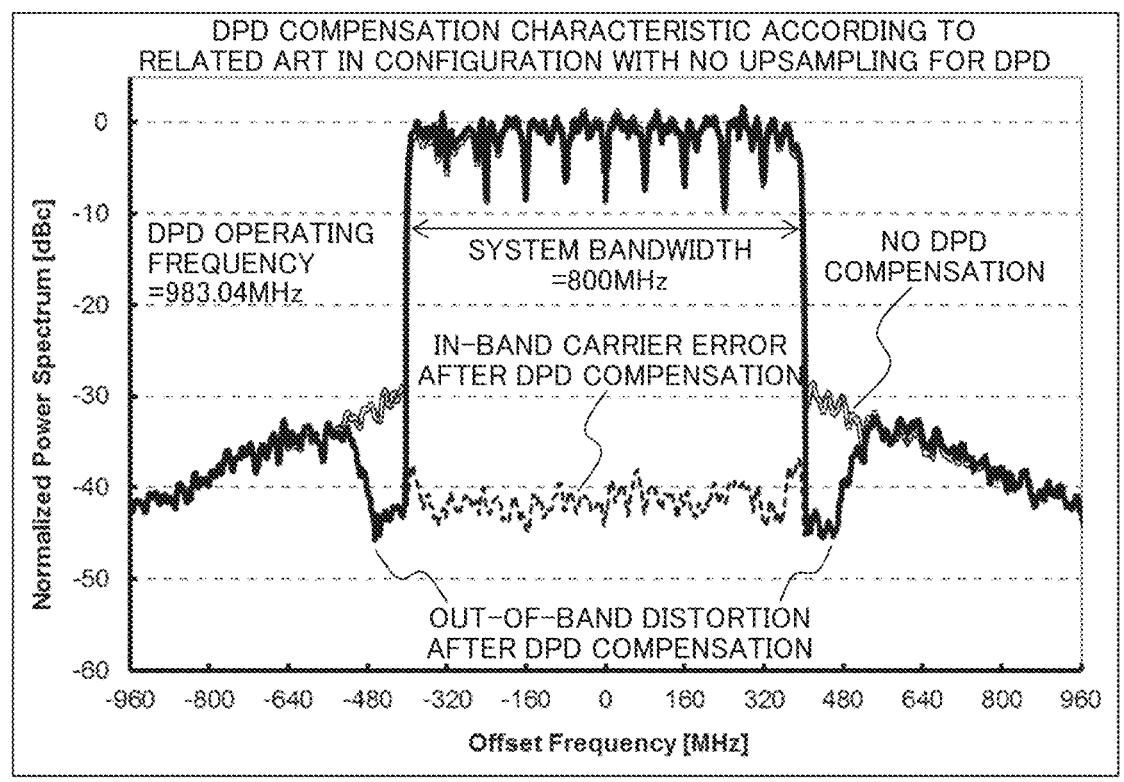
FIG. 6 is a view showing an example of a distortion compensation characteristic when a configuration of a related art is applied to a DPD in a distortion compensation apparatus in which upsampling for the DPD is not performed.

FIG. 6 shows a distortion compensation characteristic when the above-described equation (8) and the configuration of FIG. 11 are applied to the DPD 1 in the distortion compensation apparatus in which the upsampling for the DPD shown in FIG. 14 is not performed.

In the example of FIG. 6, a signal having a system band of 800 MHz at a sampling frequency of 983.04 MHz is used as an input signal of the DPD 1 without upsampling it, and the above equation (8) and the configuration of FIG. 11 are applied to operate the DPD 1 by performing adaptive control using the following equation (22) as an error evaluation function. The characteristic shown in FIG. 6 is a distortion compensation characteristic in which an output signal of the DPD 1 at this time is input to the generalized memory polynomial model of the power amplifier after it is interpolated by the interpolation DA converter 2.

$$NRMSE = 10 \cdot \log_{10}\left(\frac{\sum_{n=1}^{N} |z(n) - x(n)|^2}{\sum_{n=1}^{N} |x(n)|^2}\right) \quad (22)$$

Note that in the equation (22), x(n) is substituted for $x_u$(n) in the equation (10), and z(n) is substituted for $z_u$(n) in the equation (10) according to FIG. 14 in order to conform to the configuration in which the up sampling for the DPD is not performed.

Figure 12:
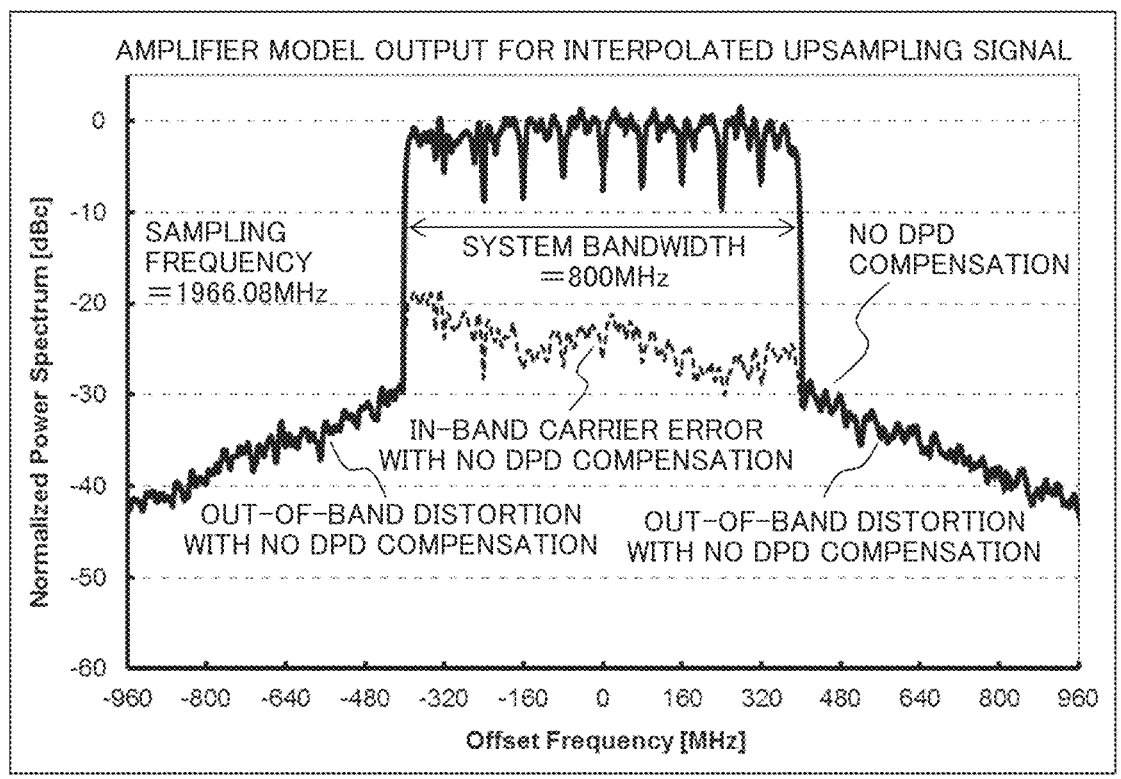
FIG. 12 is a view showing an example of a distortion characteristic of an output of a power amplifier model for an interpolated and up sampled signal when the DPD is not operated.
Figure 13:
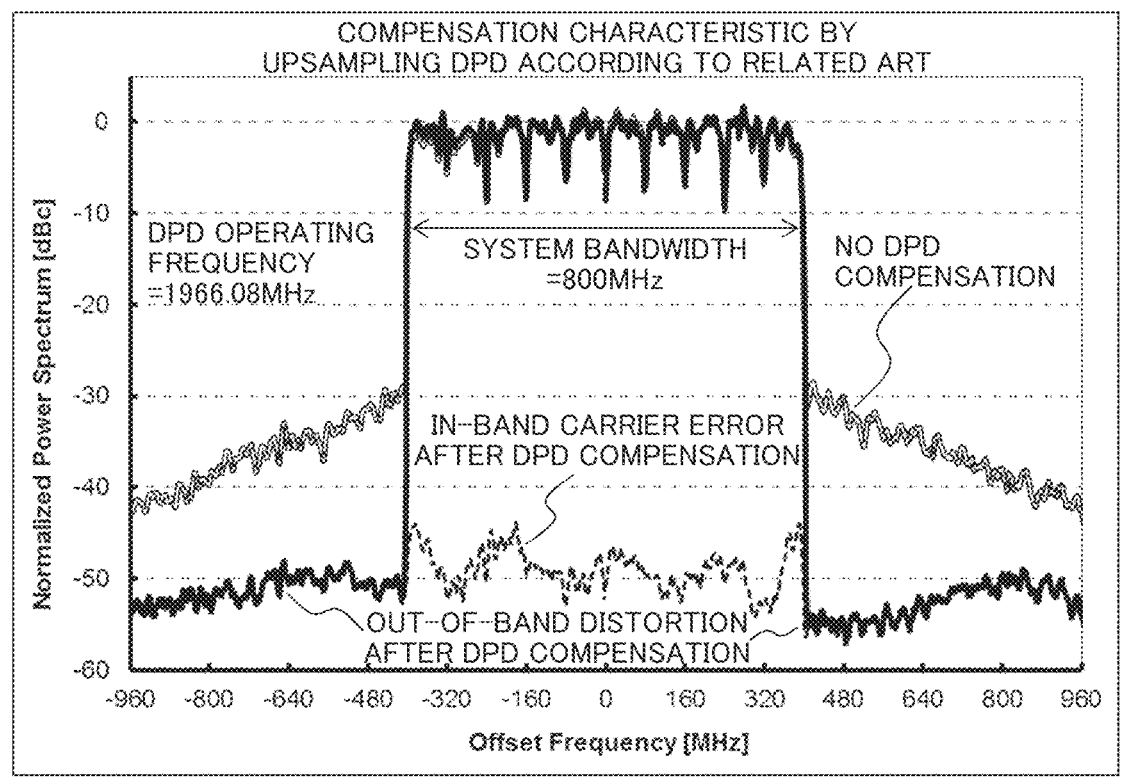
FIG. 13 is a view showing a compensation characteristic by an up sampling DPD according to the related art.

In the above equation (8) and the configuration of FIG. 11, the DPD 1 operating at the sampling rate before the interpolation which is performed by the interpolation DA converter 2 at the downstream of the DPD 1 cannot generate a distortion compensation signal that compensates the memory effect within the carrier band for the sub-samples. Thus, in particular, an error from a carrier signal due to distortion within a carrier band can be suppressed only to the average value of 41.1 dBc as compared with the average value of 23.6 dBc when the DPD shown in FIG. 12 is not operated. Further, the peak value cannot satisfy the target of the SNR distribution within the carrier band at the time of the above 256 QAM.

Figure 7:
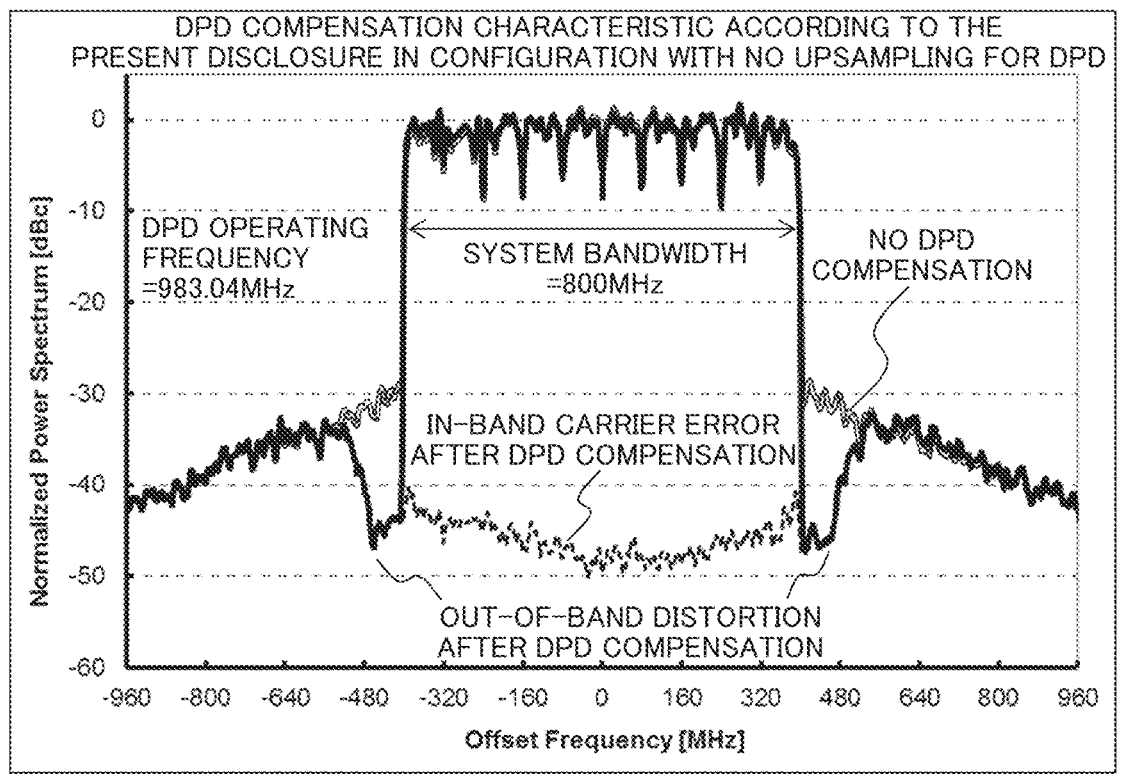
FIG. 7 is a view showing an example of a distortion compensation characteristic when a configuration according to an embodiment of the present disclosure is applied to a DPD in a distortion compensation apparatus in which upsampling for the DPD is not performed.

FIG. 7 shows the distortion compensation characteristic when the above-described equation (20) and the configuration of FIG. 1 are applied to the DPD 1 in the distortion compensation apparatus in which the upsampling for the DPD shown in FIG. 14 is not performed, which is proposed in this embodiment.

In the example of FIG. 7, a signal having a system band of 800 MHz at a sampling frequency of 983.04 MHz is used as an input signal of the DPD 1 without upsampling it, and the above equation (20) and the configuration of FIG. 1 are applied to operate the DPD 1 by performing adaptive control using the above equation (22) as an error evaluation function. The characteristic shown in FIG. 7 is a distortion compensation characteristic in which an output signal of the DPD 1 at this time is input to the generalized memory polynomial model of the power amplifier after it is interpolated by the interpolation DA converter 2.

As shown in the equation (20) and the description of FIG. 1, the distortion compensation signal that compensates the memory effect within the carrier band for the sub-samples of the DPD 1 can be generated by the sub-sample memory taps achieved by the pseudo-interpolation and sub-sample shift filters 101*a* and 101*b* and the sub-sample FIR taps achieved by the sub-sample delay filter 111. Thus, it can be seen that an error from a carrier signal due to distortion within a carrier band can be suppressed only to the average value of 45.5 dBc as compared with the average value of 23.6 dBc when the DPD shown in FIG. 12 is not operated. It is also found that compensation performance to achieve the target SNR distribution within the carrier band at the time of the above 256 QAM including the peak value can be achieved.

As described above, it is assumed that the DPD 1 according to this embodiment operates at a low sampling rate for sampling an input signal not upsampled for the DPD at the upstream of the DPD 1.

The DPD according to this embodiment can generate, from the sample signal sequence of the input signal of the DPD 1 not being upsampled, for example, the signal corresponding to the signal $x_u(n-l_s)$ upsampled by a factor of 2 in the above equation (8) in which the coefficient amount is reduced and FIG. 11 using the polynomial structure including the pseudo-interpolation and sub-sample shift filters 101*a* and 101*b*.

In addition, the DPD 1 according to this embodiment can achieve the FIR filter equivalent to the FIR filter$_0$ 405*a*, the FIR filter$_1$ 405*b*, and the FIR filter$_2$ 405*c* operating at the double sampling frequency in, for example, FIG. 11 using the FIR filter$_0$ 107*a*, the FIR filter$_1$ 107*b*, and the FIR filter$_2$ 107*c* including the sub-sample delay filter 111 disposed at the downstream of the polynomial structure.

For this reason, by using the polynomial structure and the FIR filter$_0$ 107*a*, the FIR filter$_1$ 107*b*, and the FIR filter$_2$ 107*c*, the DPD 1 according to this embodiment not only compensates for the distortion due to the sample point but also compensates for the sample point and the distortion due to the sub-sample point between the sample point and the sample point.

Therefore, the distortion compensation apparatus according to this embodiment does not perform upsampling processing for the DPD at the upstream of the DPD 1 and operates at a low sampling rate. Further, the distortion compensation apparatus according to this embodiment can reduce the coefficient calculation amount and reduce the operating frequency of the DPD 1 and the sampling rates of the DA converter 2 and the AD converter 7 as compared with the upsampling distortion compensation apparatus according to the related art. Additionally, the distortion compensation apparatus according to this embodiment can achieve the target compensation performance, because it is possible to compensate the memory effect within the carrier band by the sub-sample memory taps between the sample points of the DPD 1.

Although various aspects of the present disclosure have been described with reference to the embodiments, the present disclosure is not limited by the above descriptions. Various changes that can be understood by those skilled in the art within the scope of the present disclosure can be made to the configuration and details in each aspect of the present disclosure.

For example, the number of the memory taps $l_s$ and the number of the FIR taps $r_s$ shown in the above embodiments are examples, and the present disclosure is not limited to them. For example, in the above embodiments, the number of memory taps $l_s$ is set to three, and the number of FIR taps $r_s$ is set to five as an example of approximating the seventh-order memory polynomial model. However, the number of memory taps $l_s$ may be set to five, and the number of FIR $r_s$ may be set to three to approximate the seventh-order memory polynomial model. Alternatively, the number of taps may be increased, if increases in the circuit size and coefficient calculation amount are tolerable.

The polynomial structure including the pseudo-interpolation and sub-sample shift filter shown in the above embodiments is an example, and the present disclosure is not limited to this. For example, regarding the polynomial structure shown in the above equation (20), a signal of:

$$x\left(n+\frac{3-i-j-l_s-r_s}{2}\right)$$

and an LUT output of:

$$K_{l_s}\left(\left|x\left(n+\frac{3-i-j-l_s-r_s}{2}\right)\right|\right)$$

may be complex-multiplied by terms having different values of the memory taps $l_s$, i.e., the complex-multiplied with the cross terms.

According to the present disclosure, it is possible to achieve an effect that provides a distortion compensation apparatus and a distortion compensation method capable of achieving target compensation performance while reducing a coefficient amount even when a configuration in which an interpolation circuit at an upstream of a DPD is deleted, and upsampling for the DPD is not performed is employed.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A distortion compensation apparatus for compensating non-linear distortion of a power amplifier, the distortion compensation apparatus comprising:
   an AD converter configured to feed back an output signal of the power amplifier, convert it from analog to digital, and output the converted signal as a feedback signal;
   a digital predistorter configured to perform distortion compensation processing on an input signal using the feedback signal and output a signal which has been subjected to the distortion compensation processing;
   a DA converter disposed between the digital predistorter and the power amplifier and configured to convert the output signal of the digital predistorter from digital to analog and output the converted signal to the power amplifier, wherein the digital predistorter operates at a sampling rate at which the input signal not upsampled at an upstream of the digital predistorter is sampled, the digital predistorter comprises:
- a polynomial structure comprising a pseudo-interpolation and sub-sample shift processing unit configured to pseudo-interpolate a sample point between the sample points of the input signal and shift the pseudo-interpolated sample point by a sub-sample; and
- an FIR (Finite Impulse Response) filter disposed at a downstream of the polynomial structure and including a sub-sample delay filter configured to delay the sample point of the input signal by the sub-sample, and the digital predistorter uses the polynomial structure and the FIR filter to compensate distortion by the sample point of the input signal and also compensate distortion by a sub-sample point between the sample points of the input signal for the digital predistorter.

2. The distortion compensation apparatus according to claim 1, wherein the digital predistorter comprises:
- a plurality of the FIR filters; and
- a first adder configured to add an output signal of each of the plurality of the FIR filters and output an added signal, the digital predistorter includes a configuration in which a plurality of first paths of the polynomial structure are branched in parallel from an input stage of the digital predistorter, and the plurality of the FIR filters are disposed at a downstream of each of the plurality of first paths, and the first adder is disposed at a downstream of the plurality of FIR filters, and the pseudo-interpolation and sub-sample shift processing unit is disposed in the first path.

3. The distortion compensation apparatus according to claim 2, wherein the plurality of the first paths include the first path in which the pseudo-interpolation and sub-sample shift processing unit is disposed and the first path in which the pseudo-interpolation and sub-sample shift processing unit is not disposed.

4. The distortion compensation apparatus according to claim 3, wherein the pseudo-interpolation and sub-sample shift processing unit is a filter including a fixed tap coefficient, and a first delay device including a delay amount determined by the number of taps of the pseudo-interpolation and sub-sample shift processing unit is disposed in the first path in which the pseudo-interpolation and sub-sample shift processing unit is not disposed.

5. The distortion compensation apparatus according to claim 2, wherein each of the plurality of the FIR filters includes a configuration in which a plurality of second paths are branched in parallel from the input stage of the FIR filter, and the sub-sample delay filter is disposed in the second path.

6. The distortion compensation apparatus according to claim 5, wherein the plurality of second paths include the second path in which the sub-sample delay filter is disposed and the second path in which the sub-sample delay filter is not disposed.

7. The distortion compensation apparatus according to claim 6, wherein the sub-sample delay filter is a filter including a fixed tap coefficient, and a second delay device including a delay amount determined by the number of taps of the sub-sample delay filter is disposed in the second path in which the sub-sample delay filter is not disposed.

8. The distortion compensation apparatus according to claim 7, wherein each of the plurality of FIR filters comprises one-sample delay device configured to delay the sample point of the input signal by one sample, in the second path in which the sub-sample delay filter is disposed, the one-sample delay device is disposed at a downstream of the sub-sample delay filter, and in the second path in which the sub-sample delay filter is not disposed, the one-sample delay device is disposed at a downstream of the second delay device.

9. The distortion compensation apparatus according to claim 8, wherein each of the plurality of FIL filters comprises:
- a plurality of multipliers configured to multiply each of output signals of the sub-sample delay filter, the second delay device, and the one-sample delay device by a corresponding filter coefficient; and
- a second adder configured to add the output signal of each of the plurality of multipliers and output an added signal.

10. A distortion compensation method performed by a distortion compensation apparatus for compensating non-linear distortion of a power amplifier, the distortion compensation method comprising:

performing distortion compensation processing by a digital predistorter on an input signal using a feedback signal obtained by feeding back an output signal of the power amplifier and converting it from analog to digital and outputting the signal which has been subjected to the distortion compensation processing; and converting the output signal of the digital predistorter from digital to analog and outputting the converted signal to the power amplifier, wherein the digital predistorter operates at a sampling rate at which the input signal not upsampled at an upstream of the digital predistorter is sampled, the digital predistorter comprises:
- a polynomial structure comprising a pseudo-interpolation and sub-sample shift processing unit configured to pseudo-interpolate a sample point between the sample points of the input signal and shift the pseudo-interpolated sample point by a sub-sample; and
- an FIR (Finite Impulse Response) filter disposed at a downstream of the polynomial structure and including a sub-sample delay filter configured to delay the sample point of the input signal by the sub-sample, and the digital predistorter uses the polynomial structure and the FIR filter to compensate distortion by the sample point of the input signal and also compensate distortion by a sub-sample point between the sample points of the input signal for the digital predistorter.

* * * * *

UNITED STATES PATENT AND TRADEMARK OFFICE
CERTIFICATE OF CORRECTION

PATENT NO. : 10,554,183 B2
APPLICATION NO. : 16/244913
DATED : February 4, 2020
INVENTOR(S) : Yoshiaki Doi It is certified that error appears in the above-identified patent and that said Letters Patent is hereby corrected as shown below:

Column 20, Embodiments, Line 19; Delete "$C_1, C_2, \ldots, C_{i-1}, C_{1+1}, \ldots,$ and $C_{2i-1}$." and insert --$C_1, C_2, \ldots, C_{i-1}, C_i, C_{i+1}, \ldots,$ and $C_{2i-1}$.-- therefor Signed and Sealed this
Fifth Day of May, 2020

Andrei Iancu
*Director of the United States Patent and Trademark Office*